(12) United States Patent
Kim

(10) Patent No.: US 7,816,964 B2
(45) Date of Patent: Oct. 19, 2010

(54) PULSE OPERATED FLIP-FLOP CIRCUIT HAVING TEST-INPUT FUNCTION AND ASSOCIATED METHOD

(75) Inventor: Min-Su Kim, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 174 days.

(21) Appl. No.: 12/256,244

(22) Filed: Oct. 22, 2008

(65) Prior Publication Data

US 2009/0115481 A1    May 7, 2009

(51) Int. Cl.
*H03K 3/00* (2006.01)
(52) U.S. Cl. ...................... 327/218; 327/200
(58) Field of Classification Search .............. 327/218, 327/200

See application file for complete search history.

(56) References Cited

U.S. PATENT DOCUMENTS 7,154,319 B2    12/2006    Kim

2006/0085709 A1    4/2006    Kim et al.

FOREIGN PATENT DOCUMENTS

| KR | 1020050112972 | 12/2005 |
| KR | 1020060029551 | 4/2006 |

*Primary Examiner*—Lincoln Donovan
*Assistant Examiner*—Daniel Rojas
(74) *Attorney, Agent, or Firm*—F. Chau & Associates, LLC

(57) ABSTRACT

The pulse generation circuit generates a first pulse signal and a complementary second pulse signal. The first and second pulse signals are activated simultaneously in a normal mode and activated selectively in response to a test input signal in a test mode. A multiplexing input circuit selects and outputs one of a data input signal and a test input signal as a latch input signal in response to the first pulse signal and the second pulse signal. The latch input signal corresponds to the data input signal in the normal mode and corresponds to the test input signal in the test mode. The latching circuit latches the latch input signal to generate data output signal. The length of data transfer path is reduced, and DtoQ delay can be decreased.

20 Claims, 13 Drawing Sheets

PULSE OPERATED FLIP-FLOP CIRCUIT HAVING TEST-INPUT FUNCTION AND ASSOCIATED METHOD

This application claims priority, under 35 USC §119, of Korean Patent Application No. 2007-112636, filed on Nov. 6, 2007 in the Korean Intellectual Property Office (KIPO), which is incorporated by reference herein in its entirety.

BACKGROUND

1. Technical Field

This disclosure relates to semiconductor memory devices, and more particularly to flip-flop circuits having a test-input function and methods of latching data using pulses and according to normal and test operation modes.

2. Description of the Related Art

A semiconductor integrated circuit may include a plurality of flip-flops and each flip-flop latches data and outputs the latched data. Input and output operations of a flip-flop may be performed in synchronization with a clock signal. For example, the flip-flop may latch input data in synchronization with a rising edge of the clock signal and maintain the latched data until the next rising edge of the clock signal. Alternatively the flip-flop may latch input data in synchronization with a falling edge or in synchronization with both rising and falling edges.

A design-for-testability (DFT) technique is a design method adopted for enhancing and verifying the integrity of semiconductor chips. A scan test technique and a BIST (Built-in-Test) have been developed for practicing the DFT technique and are widely used to reduce the time it takes to test a semiconductor chip. In the scan test, a plurality of flip-flops form a scan chain, and the flip-flops function as a shift register. Almost all application-specific integrated circuits (ASICs) include a master-slave flip-flop of a multiplexer type to implement a test input function for the scan test.

FIG. 1 is a circuit diagram of a conventional master-slave flip-flop circuit, which is disclosed in U.S. Patent Application Publication No. 2006/0085709.

Referring to FIG. 1, a conventional master-slave flip-flop circuit 100 includes a first (master) latch 122, a second (slave) latch 124 and a (input) multiplexer 126.

The multiplexer 126 multiplexes a data signal D and a scan input signal SI based upon the value of a scan enable signal SE. The multiplexer 126 includes a first AND-gate 102 performing an AND operation upon the data signal D and an inverted scan enable signal ~SE, a second AND-gate 104 performing an AND operation upon the scan input signal SI and the scan enable signal SE, and a NOR-gate 106 performing a NOR operation upon the outputs of the first and second AND-gates 102 and 104. The first latch 122 includes cross-connected inverters 110 and 112, and the second latch 124 includes cross-connected inverters 116 and 118. Each of the first and second latches 122 and 124 includes a tri-state inverter (112, 118) that is gated by a clock signal CK. Tri-state inverter 112 inverts the output of a first inverter 110 and applies the inverted signal to an input node of the first inverter 110 when the clock signal CK is in logic High level. Tri-state inverter 118 inverts the output of a second inverter 116 and applies the inverted signal to an input node of the second inverter 116 when the clock signal CK is in logic High level.

A tri-state inverter 108 is connected between the input multiplexer 126 and the first latch 122. The tri-state inverter 108 inverts the output of the NOR-gate 106 of the input multiplexer 126 and outputs the inverted signal when a clock signal CK is at a logic Low level. Tri-state inverter 114 inverts the output of the first inverter 110 and outputs the inverted signal when the clock signal CK is in logic Low level. A third inverter 120 inverts and amplifies the output of the second inverter 116.

When the scan enable signal SE is in logic Low state, the data signal D is transferred through the first AND-gate 102 and into the NOR-gate 106. In this case, when the clock signal CK is in logic Low level the first tri-state inverter 108 is turned ON and inverts the output of the NOR-gate 106 to transfer the inverted signal to the first latch 122, and when the clock signal CK is in logic High level the first tri-state inverter 108 is turned OFF and then first latch 122 stores the transferred data signal D. In the next cycle of the clock signal CK, when the clock signal CK is in logic Low level the third tri-state inverter 114 is turned ON and inverts the output of the first latch 122 to transfer the inverted signal to the second latch 124, and when the clock signal CK is in logic High level the third tri-state inverter 114 is turned OFF and the second latch 124 maintains the transferred data until the clock signal CK transitions subsequently.

As semiconductor integrated circuits become complicated, further limitations are added to the scan test and flip-flops capable of operating at high speed are required. The conventional flip-flop circuit 100 sequentially transfers data during each two cycles of the clock signal CK, thereby increasing delay in outputting data. In addition, the input multiplexer 126 for selecting the input of the master-slave flip-flop circuit 100 further increases the delay time since the data transfer path is prolonged. The master-slave flip-flops having such configurations are inadequate for high-speed semiconductor devices due to relatively large DtoQ delay between input and output of the flip-flop.

SUMMARY OF THE INVENTION

Some exemplary embodiments of the invention provide a pulse-based flip-flop circuit having a test-input function capable of operating at a relatively high speed.

Some exemplary embodiments of the invention provide a method of latching alternate data sources according to alternate operation modes.

In some exemplary embodiments of the invention, a flip-flop circuit includes a pulse generation circuit, a multiplexing input circuit and a latching circuit.

The pulse generation circuit generates a first pulse signal and a second pulse signal, such that while in a normal mode the first and second pulse signals are activated simultaneously and while in a test mode are activated selectively in response to a test input signal. The input circuit selects between the in response to data input signal and the test input signal to generate a latch input signal in response to the first pulse signal and the second pulse signal. The latch input signal corresponds to the data input signal in the normal mode and corresponds to the test input signal in the test mode. The latching circuit latches the latch input signal to generate a data output signal.

The input circuit may generate the latch input signal corresponding to the test input signal in response to the first and second pulse signals, irrespective of the data input signal in the test mode.

The input circuit may include a pair of p-type metal oxide semiconductor (PMOS) transistors connected in parallel, the parallel PMOS transistors respectively receiving the data input signal and an inversion signal of a test enable signal, a pair of n-type metal oxide semiconductor (NMOS) transistors connected in parallel, the parallel NMOS transistors respectively receiving the data input signal and the test enable signal, and a pair of complementary metal oxide semiconductor (CMOS) transistors receiving the first and second pulse signals. In general, the complementary metal oxide semiconductor (CMOS), the pair of parallel PMOS transistors and the pair of parallel NMOS transistors may be connected in series between a power supply voltage and a ground voltage. The complementary metal oxide semiconductor (CMOS) may be connected between the pair of parallel PMOS transistors and the pair of parallel NMOS transistors.

For example, the input circuit may include a first PMOS transistor connected between a first voltage and a first node, the first PMOS transistor receiving the data input signal, a second PMOS transistor connected between the first voltage and the first node in parallel with the first PMOS transistor, the second PMOS transistor receiving an inversion signal of a test enable signal, a third PMOS transistor connected between the first node and an output node, the third PMOS transistor receiving the second pulse signal, a first NMOS transistor connected between a second voltage and a second node, the first NMOS transistor receiving the data input signal, a second NMOS transistor connected between the second voltage and the second node in parallel with the first NMOS transistor, the second NMOS transistor receiving the test enable signal, and a third NMOS transistor connected between the second node and the output node, the third NMOS transistor receiving the first pulse signal.

The pulse generation circuit may include a pulse generator configured to generate a first reference pulse signal and a second reference pulse signal based upon a clock signal, the second reference pulse signal being an inversion signal of the first reference pulse signal, and a conditional logic circuit. The conditional logic circuit is configured to, while in the test mode, select the first reference pulse signal and/or the second reference pulse signal in response to test input signal and to output the first and/or second pulse signal. The pulses of the first reference pulse signal may be synchronized with the clock signal.

The conditional logic circuit inverts the first and second reference pulse signals in the normal mode to generate the first and second pulse signals that are simultaneously activated, and deactivates a selected one of the first and second reference pulse signals in response to the test input signal in the test mode to generate the first and second pulse signals that are selectively activated.

The conditional logic circuit may include a first logic circuit configured to generate the first pulse signal that is activated as positive pulses, and a second logic circuit configured to generate the second pulse signal that is activated as negative pulses.

In an exemplary embodiment of the invention, the first logic circuit may include a first PMOS transistor connected between a first voltage and a first node, the first PMOS transistor receiving a test enable signal, a second PMOS transistor connected between the first voltage and the first node in parallel with the first PMOS transistor, the second PMOS transistor receiving the test input signal, and a first inverter connected between the first node and a second voltage, the first inverter receiving the first reference pulse signal to generate the first pulse signal. In this case, the second logic circuit may include a first NMOS transistor connected between the second voltage and a second node, the first NMOS transistor receiving an inversion signal of the test enable signal, a second NMOS transistor connected between the second voltage and the second node in parallel with the first NMOS transistor, the second NMOS transistor receiving the test input signal, and a second inverter connected between the second node and the second voltage, the second inverter receiving the second reference pulse signal to generate the second pulse signal.

In another exemplary embodiment of the invention, the first logic circuit may include a first PMOS transistor connected between a first voltage and a first node, the first PMOS transistor receiving the first reference pulse signal, a second PMOS transistor connected between the first node and a second node, the first pulse signal being output at the second node, the second PMOS transistor receiving a test enable signal, a first NMOS transistor connected between the second node and a second voltage, the first NMOS transistor receiving the first reference pulse signal, and a third PMOS transistor connected between the first node and the second node in parallel with the second PMOS transistor, the third PMOS transistor receiving the test input signal. In this case, the second logic circuit may include a second NMOS transistor connected between the second voltage and a third node, the second NMOS transistor receiving the second reference pulse signal, a third NMOS transistor connected between the third node and a fourth node, the second pulse signal being output at the fourth node, the third NMOS transistor receiving an inversion signal of the test enable signal, a fourth PMOS transistor connected between the fourth node and the first voltage, the fourth NMOS transistor receiving the second reference pulse signal, and a fourth NMOS transistor connected between the third node and the fourth node in parallel with the third NMOS transistor, the fourth NMOS transistor receiving the test input signal.

In still another embodiment of the invention, the first logic circuit may include a first PMOS transistor connected between a first voltage and a first node, the first PMOS transistor receiving a test enable signal, a first inverter connected between the first node and a second voltage, the first inverter receiving the first reference pulse signal to generate the first pulse signal, a second PMOS transistor connected between the first voltage and the first node in parallel with the first PMOS transistor, the second PMOS transistor receiving the test input signal, a first NMOS transistor connected between the first node and a second node, the first NMOS transistor receiving the test enable signal, and a second NMOS transistor connected between the second node and the second voltage, the second NMOS transistor receiving the test input signal. In this case, the second logic circuit may include a third NMOS transistor connected between the second voltage and a third node, the third NMOS transistor receiving an inversion signal of the test enable signal, a second inverter connected between the third node and the first voltage, the second inverter receiving the second reference pulse signal to generate the second pulse signal, a fourth NMOS transistor connected between the second voltage and the third node in parallel with the third NMOS transistor, the fourth NMOS transistor receiving the test input signal, a third PMOS transistor connected between the third node and a fourth node, the third PMOS transistor receiving the inversion signal of the test enable signal, and a fourth PMOS transistor connected between the fourth node and the first voltage, the fourth PMOS transistor receiving the test input signal.

The latching circuit may include a tri-state inverter configured to operate in response to the first and second pulse signals.

In an exemplary embodiment of the invention, the latching circuit may include a NOR-gate configured to perform a NOR operation upon an inversion signal of a reset signal and a signal at a latch node, and a tri-state inverter configured to invert the output of the NOR-gate in response to the first and second pulse signal, and configured to apply the output of the tri-state inverter to the latch node. The pulse generation circuit may deactivate the first and second pulse signal while the reset signal is activated.

In another exemplary embodiment of the invention, the latching circuit may include a NAND-gate configured to perform a NAND operation upon a set signal and a signal at a latch node, and a tri-state inverter configured to invert the output of the NAND-gate in response to the first and second pulse signal, and configured to apply the output of the tri-state inverter to the latch node. The pulse generation circuit may deactivate the first and second pulse signal while the set signal is activated.

In a method according to an exemplary embodiment of the invention, a first pulse signal and a second pulse signal are generated such that the first and second pulse signals are activated simultaneously in a normal mode and activated selectively in response to a test input signal in a test mode. A latch input signal is generated in response to data input signal, the first pulse signal and the second pulse signal. The latch input signal corresponds to the data input signal in the normal mode and corresponds to the test input signal in the test mode. The latch input signal is latched to generate data output signal.

The latch input signal may be generated by providing selectively a power supply voltage or a ground voltage in response to the data input signal in the normal mode, and by generating the latch input signal based on one of the selectively provided power supply voltage or ground voltage, and the first and second pulse signals that are simultaneously activated.

The latch input signal may be generated by providing both of a power supply voltage and a ground voltage irrespective of the data input signal in the test mode, and by generating the latch input signal based on the provided power supply voltage and ground voltage, and the first and second pulse signals that are selectively activated.

The first pulse signal and the second pulse signal may be generated by forming a first conduction path in response to the data input signal, and by forming a second conduction path in response to a test enable signal.

The first pulse signal and the second pulse signal may be generated by generating a first reference pulse signal in response to a clock signal, the first reference pulse signal including pulses synchronized with the clock signal, and by generating a second reference pulse signal by inverting the first reference pulse signal.

In the normal mode, the first and second pulse signals simultaneously activated may be generated respectively by inverting the first and second reference pulse signals.

In the test mode, the first and second pulse signals selectively activated may be generated respectively by deactivating one of the first and second reference pulse signals in response to the test input signal.

Accordingly, in accordance with the flip-flop circuits and the method of latching data, the length of data transfer path is reduced, thereby decreasing the DtoQ delay, even though the test-input function is implemented. Thus the latched data may be output at a relatively high speed. Also area occupied by the flip-flop circuit integrated on a chip may be reduced according to contraction of the data transfer path.

Various exemplary embodiments of the invention will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "connected" to another element, it can be directly connected or connected to the other element or intervening elements may be present. In contrast, when an element is referred to as being "directly connected" or "directly connected" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments of the invention and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

DETAILED DESCRIPTION OF EXEMPLARY EMBODIMENTS OF THE INVENTION

Figure 2:
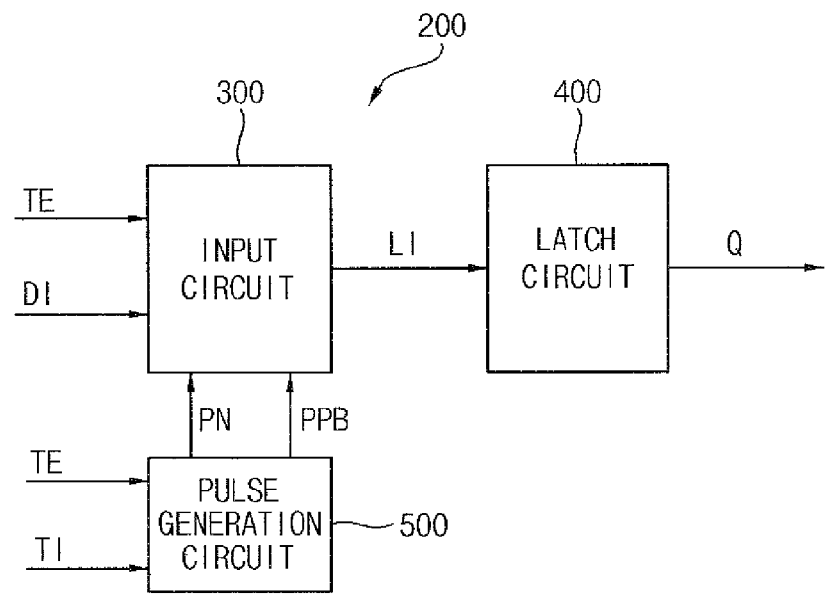
FIG. 2 is a block diagram of a flip-flop circuit having a test-input function according to an exemplary embodiment of the invention.

FIG. 2 is a block diagram of a flip-flop circuit having a test-input function according to an exemplary embodiment of the invention.

Referring to FIG. 2, a flip-flop circuit 200 includes an input multiplexing circuit 300 (see FIG. 3), a latching circuit 400 (e.g., the simple latches 400a or 400b of FIG. 4 and FIG. 5 or interruptible latches 400c, 400d, 400e, 400f of FIGS. 6, 7, 17 or 19, or a six-transistor SRAM memory cell) and a pulse generation circuit 500.

The pulse generation circuit 500 generates a first pulse signal PN and a second (complementary) pulse signal PPB such that the first and second pulse signals PN and PPB are activated simultaneously in a normal mode and activated selectively in response to a test input signal TI in a test mode. The input multiplexing circuit 300 selects and outputs one of the data input signal DI and the test input signal TI as a latch input signal LI in response to the first pulse signal PN and the second pulse signal PPB. The latch input signal LI corresponds to the data input signal DI in the normal mode and corresponds to the test input signal TI in the test mode. The latching circuit 400 latches the latch input signal LI and outputs the latched data output signal Q.

Operation modes of the flip-flop circuit 200 may be controlled by a test enable signal TE. For example, the test enable signal TE may cause the flip-flop circuit 200 to operate in the test mode when it is activated (in logic High level) and may cause the flip-flop circuit 200 to operate in the normal mode when it is deactivated (in logic Low level). The test mode may be a scan test mode for testing an integrated circuit including multiple instances of the flip-flop circuit 200.

In the test mode, the input multiplexing circuit 300 generates the latch input signal LI corresponding to the test input signal TI in response to the first and second pulse signals PN and PPB if they are selectively activated, regardless of the data input signal DI.

Figure 3:
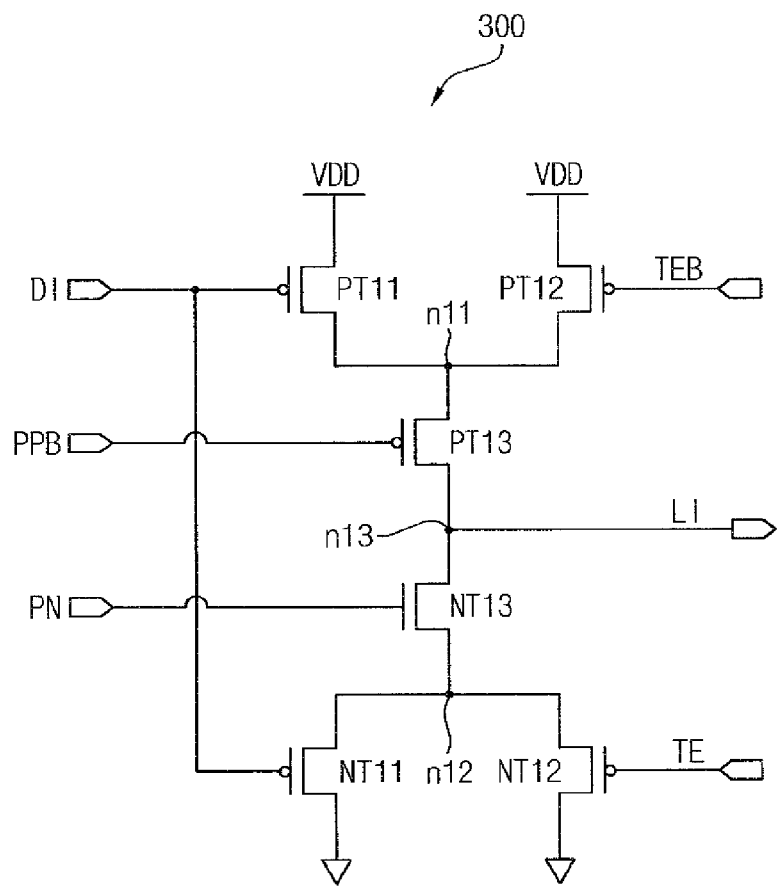
FIG. 3 is a circuit diagram of a multiplexing input circuit 300 in the flip-flop circuit of FIG. 2.

FIG. 3 is a circuit diagram of a multiplexing input circuit 300 in the flip-flop circuit of FIG. 2.

Referring to FIG. 3, the input multiplexing circuit 300 may include a pair of p-type metal oxide semiconductor (PMOS) transistors PT11 and PT12 connected in parallel between a logic High voltage supply VDD and a first node n11, a pair of n-type metal oxide semiconductor (NMOS) transistors NT11 and NT12 connected in parallel between a logic Low voltage (ground) and a second node n12, and a pair of complementary metal oxide semiconductor (CMOS) transistors PT13 and NT13 connected in series between the first node n11 and the second node n12. A third node between the series-connected between the complementary metal oxide semiconductor (CMOS) transistors PT13 and NT13 serves as the output node of the input multiplexing circuit 300.

The PMOS transistors PT11 and PT12 are connected to the power supply voltage VDD at their source electrodes, and receive the data input signal DI and an inversion signal TEB of a test enable signal TE at their gate electrodes, respectively. The NMOS transistors NT11 and NT12 are connected to a ground voltage at their source electrodes, and receive the data input signal DI and the test enable signal TE, at their gate electrodes respectively. The complementary transistors PT13 and NT13 are connected between the pair of PMOS transistors PT11 and PT12 and the pair of NMOS transistors NT11 and NT12. Thus the transistors PT13 and NT13 are connected between a common drain of the PMOS transistors PT11 and PT12 and a common drain of NMOS transistors NT11 and NT12. The CMOS transistors PT13 and NT13 receive the first and second pulse signals PN and PPB, respectively.

In alternative embodiments the polarity of transistors can be switched and/or the stacking of transistors in the input multiplexing circuit 300 can be varied. For example transistor PT13 may be connected between the logic High voltage supply VDD and the first node n11 while the pair of p-type metal oxide semiconductor (PMOS) transistors PT11 and PT12 are connected in parallel between the first node n11 and the third (output) node n13. Meanwhile, the pair of p-type metal oxide semiconductor (PMOS) transistors PT11 and PT12 may be connected in parallel between the third (output) node n13 and the second node n12 while transistor NT13 is be connected between the second node n12 and the ground.

In other alternative embodiments, PMOS transistor PT13 may be replaced with two smaller PMOS transistors PT13-d and PT13-t, wherein PMOS transistors PT11 and PT13-d are connected in series between the logic High voltage supply VDD and the third (output) node n13, and wherein PMOS transistors PT12 and PT13-t are connected in series between the logic High voltage supply VDD and the third (output) node n13. Similarly, NMOS transistor NT13 may be replaced with two smaller NMOS transistors NT13-d and NT13-t, wherein BMOS transistors NT11 and NT13-d are connected in series between the third (output) node n13 and the ground, and wherein NMOS transistors NT12 and NT13-t are connected in series between the third (output) node n13 and the ground.

Referring to FIG. 3, the input multiplexing circuit 300 may include first, second and third PMOS transistors PT11, PT12 and PT13, and first, second and third NMOS transistors NT11, NT12 and NT13.

The first PMOS transistor PT11 is connected between a first voltage (for example, the power supply voltage VDD) and a first node n11, and receives the data input signal DI. The second PMOS transistor PT12 is connected between the first voltage VDD and the first node n11 in parallel with the first PMOS transistor PT11, and receives the inversion signal TEB of the test enable signal TE. The third PMOS transistor PT13 is connected between the first node n11 and an output node n13, and receives the second pulse signal PPB. The first NMOS transistor NT11 is connected between a second voltage (for example, the ground voltage) and a second node n12, and receives the data input signal DI. The second NMOS transistor NT12 is connected between the second (ground) voltage and the second node n12 in parallel with the first NMOS transistor NT11, and receives the test enable signal TE. The third NMOS transistor NT13 is connected between the second node n12 and the output node n13, and receives the first pulse signal PN.

In the input multiplexing circuit 300 of FIG. 3, the second NMOS transistor NT12 responding to the test enable signal TE and the second PMOS transistor PT12 responding to the inversion signal TEB of the test enable signal TE are turned OFF in the normal mode and turned ON in the test mode. In the test mode, the power supply voltage VDD and the ground voltage are, irrespective of the data input signal DI, connected to the transistors PT13 and NT13 that receive the pair of pulse signals PN and PPB, since the second NMOS transistor NT12 and the second PMOS transistor PT12 are turned ON.

As such, the input multiplexing circuit 300 may include two conduction paths, i.e., first and second conduction paths to generate the latch input signal LI. The first conduction path is formed through the transistors PT11 and NT11 in response to the data input signal DI, and the second conduction path is formed through the transistors PT12 and NT12 in response to the test enable signal TE. Accordingly the test-input function may be activated by controlling the pair of pulse signals PN and PPB irrespective of the data input signal DI in the test mode.

Exemplary circuits and methods for generating the pair of pulse signals PN and PPB according to normal and test modes will be described later with reference to FIG. 9

FIGS. 4 through 7 are circuit diagrams of examples of a latching circuit 400 in the flip-flop circuit of FIG. 2.

Figure 4:
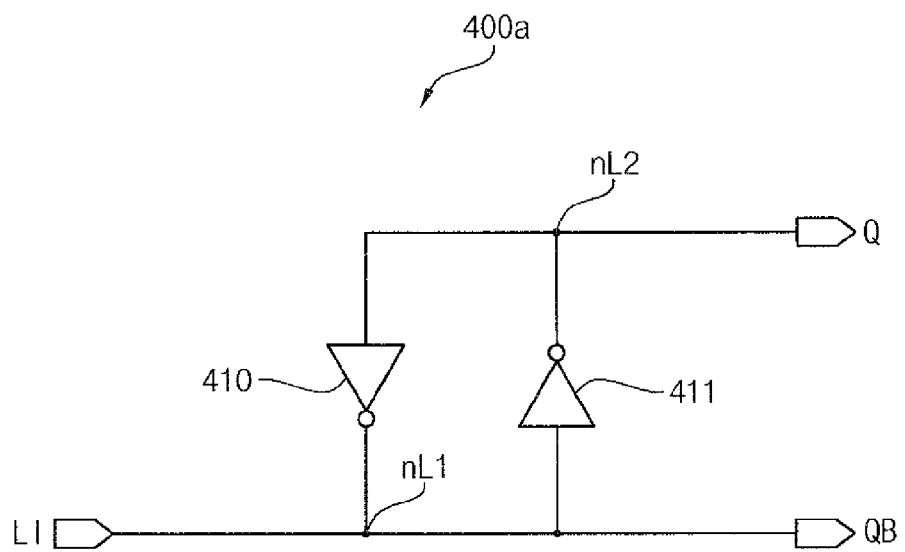
FIGS. 4 through 7 are circuit diagrams of examples of the latching circuit 400 in the flip-flop circuit of FIG. 2.

Referring to FIG. 4, a latching circuit 400a may include a first inverter 410 and a second inverter 411, where inputs and outputs of the inverters 410 and 411 are cross-connected. A latch node nL1, to which the latch input signal LI is applied, is connected to the output terminal of the first inverter 410 and to the input terminal of the second inverter 411. An inversion latch node nL2 is connected to the input terminal of the first inverter 410 and to the output terminal of the second inverter 411. In this case, the data output signal Q may be output at the inversion latch node nL2 and the inverted data output signal QB may be output at the latch node nL1.

Figure 5:
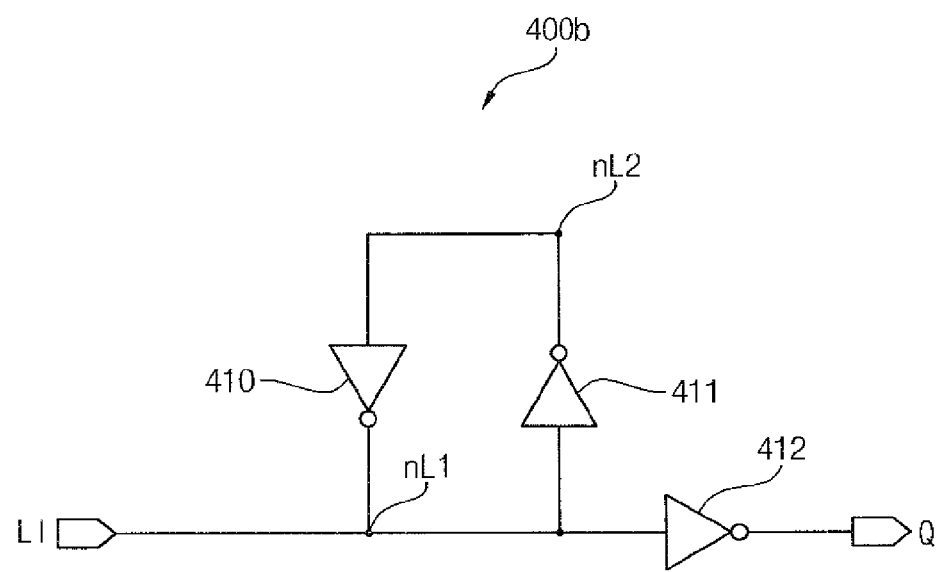

Referring to FIG. 5, a latching circuit 400b may include a first inverter 410, a second inverter 411 and a third inverter 412, where inputs and outputs of the inverters 410 and 411 are cross-connected. As in the latching circuit 400a of FIG. 4, a latch node nL1, to which the latch input signal LI is applied, is connected to the output terminal of the first inverter 410 and to the input terminal of the second inverter 411, and an inversion latch node nL2 is connected to the input terminal of the first inverter 410 and to the output terminal of the second inverter 411.

The latching circuit 410a of FIG. 4 is the same as the latching circuit 400b of FIG. 5 except for including the additional the third inverter 412 for inverting a signal at the latch node nL1 to output the data output signal Q. The third inverter 412 may function as a buffer or as a driver for amplifying the signal at the latch node nL1.

Figure 6:
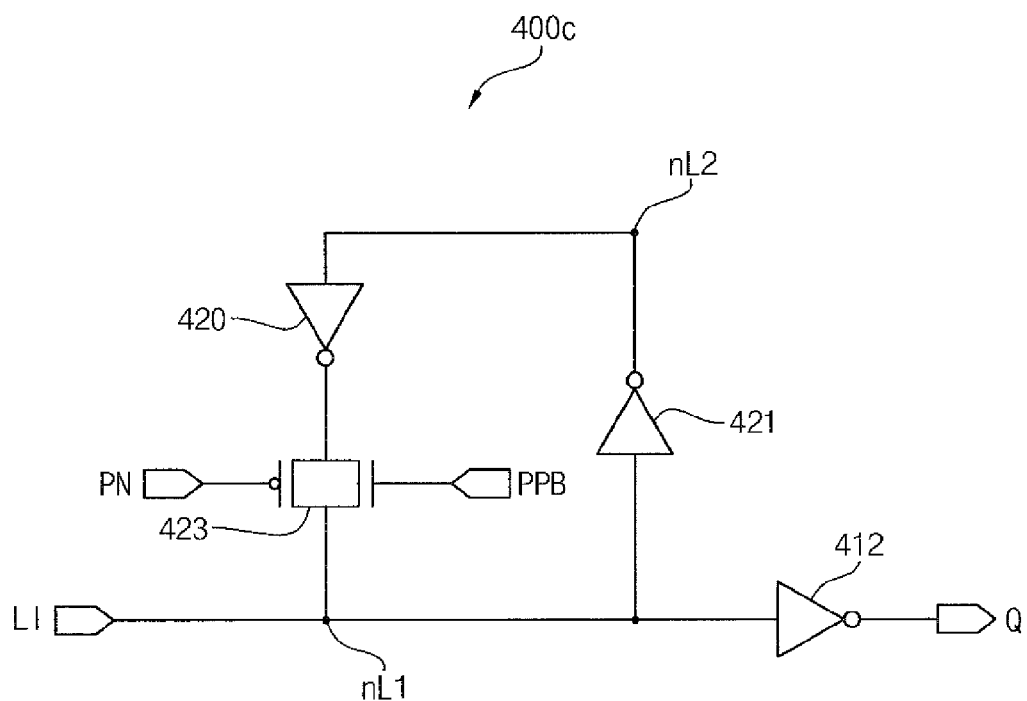

Referring to FIG. 6, a latching circuit 400c includes a first inverter 420, a second inverter 421, a transmission gate 423 and a third inverter 412. A latch node nL1, to which the latch input signal LI is applied, is connected to the input terminal of the second inverter 421. An inversion latch node nL2 is connected to the input terminal of the first inverter 420 and to the output terminal of the second inverter 421. The transmission gate 423 is connected between the latch node nL1 and the output terminal of the first inverter 421. The transmission gate 423 opens and closes in response to the first and second pulse signals PN and PPB. As mentioned above, the third inverter 412 may function as a buffer or a driver for amplifying the signal at the latch node nL1, in addition to inverting the signal at the latch node nL1 to output the data output signal Q.

For example, the latch input signal LI corresponding to the data input signal DI may be applied to the latch node nL1 in the normal mode (while the first pulse signal PN is activated as a positive pulse and the second pulse signal PPB is activated as a negative pulse). In this case, the transmission gate 423 is turned OFF to block the output of the first inverter 420, and thus the voltage at the latch node nL1 may be promptly stabilized.

Figure 7:
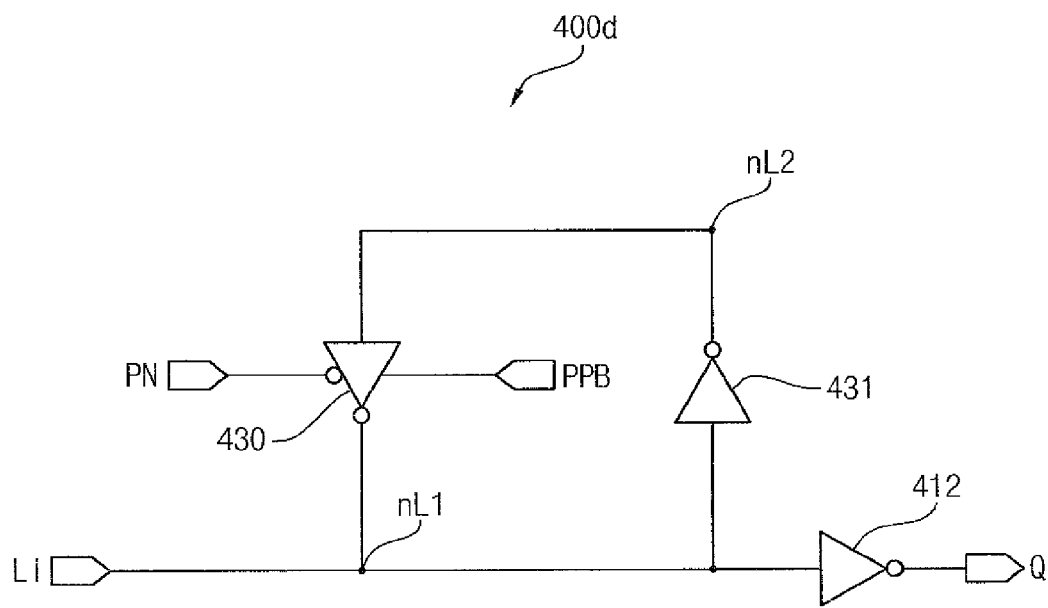

Referring to FIG. 7, a latching circuit 400d may include a first inverter 430, a second inverter 431 and a third inverter 412. The first inverter 430 of FIG. 7 may be implemented as a tri-state inverter activating and deactivating in response to the first and second pulse signals PN and PPB.

For example, the latch input signal LI corresponding to the data input signal DI may be applied to the latch node nL1 in the normal mode (while the first pulse signal PN is activated as a positive pulse and the second pulse signal PPB is activated as a negative pulse). In this case, the output terminal of the tri-state inverter 430 is floated to block the output thereof, and thus a voltage at the latch node nL1 may be promptly stabilized.

Figure 8:
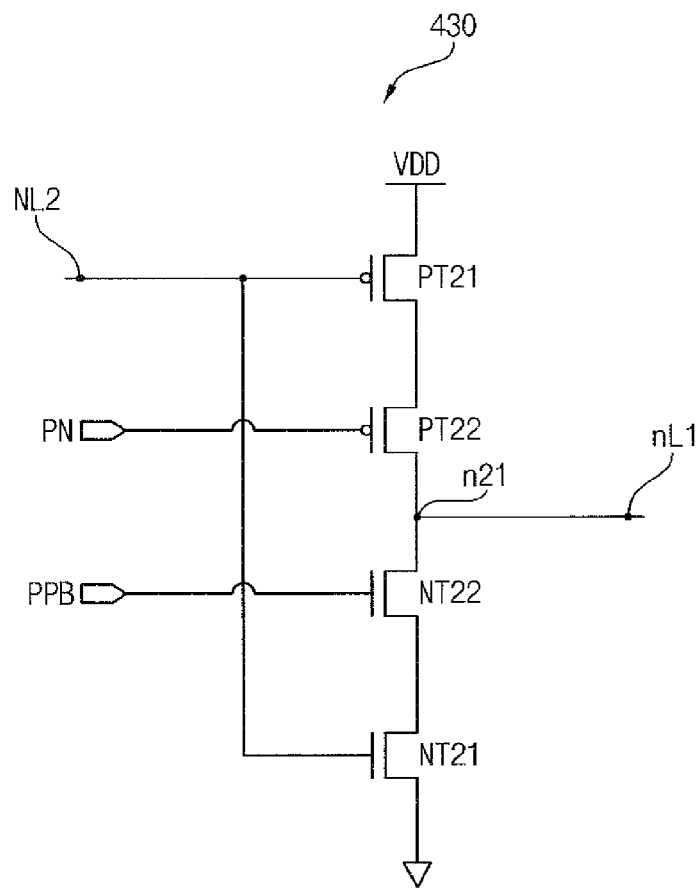
FIG. 8 is a circuit diagram of a tri-state inverter 430 in the latching circuit 400d of FIG. 7.

FIG. 8 is an example of the tri-state inverter 430 in the latching circuit 400d of FIG. 7.

Referring to FIG. 8, a tri-state inverter 430 may include a first PMOS transistor PT21, a second PMOS transistor PT22, a first NMOS transistor NT21 and a second NMOS transistor NT22, which are serially connected between the power supply voltage VDD and the ground voltage.

The interconnected transistor gates of the first PMOS transistor PT21 and the first NMOS transistor NT21 comprise the input node of the tri-state inverter 430 and are connected to the at inversion latch node nL2. The output node n21 of the tri-state inverter 430 is connected to the latch node nL1. The transistor gate of the second PMOS transistor PT22 receives the first pulse signal PN and the transistor gate of the second NMOS transistor NT22 receives the second pulse signal PPB.

In the normal mode, when the first pulse signal PN is activated as a positive pulse and simultaneously the second pulse signal PPB is activated as a negative pulse, the output of the tri-state 430 is floated since the second PMOS transistor PT22 and the second NMOS transistor NT22 are turned OFF, and thus a voltage at the latch node nL1 connected to the output node n21 of the tri-state inverter 430 may be promptly stabilized.

Figure 9:
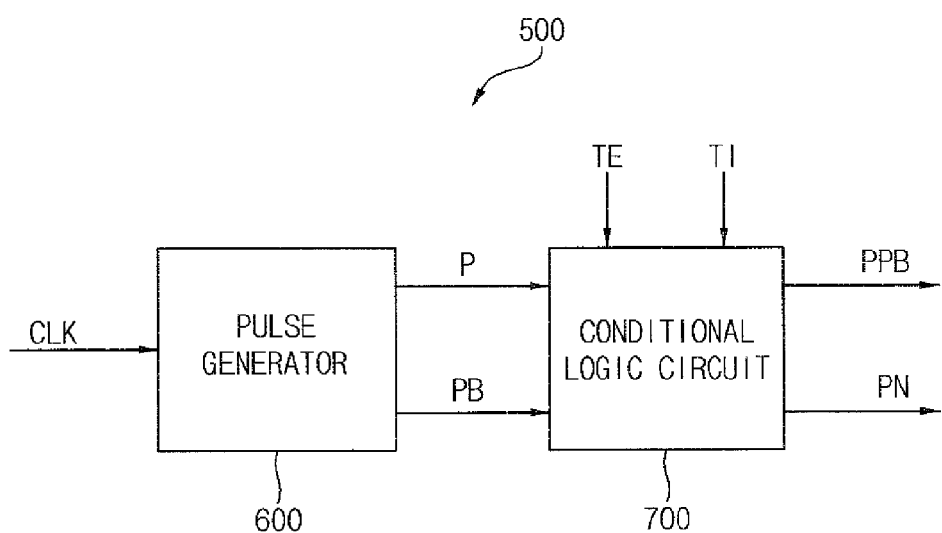
FIG. 9 is a circuit diagram of a pulse generation circuit according to an exemplary embodiment of the invention.

FIG. 9 is a block diagram of a pulse generation circuit according to an exemplary embodiment of the invention.

Referring to FIG. 9, a pulse generation circuit 500 includes a pulse generator 600 and a conditional logic circuit 700.

The pulse generator 600 generates a first reference pulse signal PB and a second (complementary) reference pulse signal P in response to a received clock signal CLK, such that the first reference pulse signal PB includes pulses synchronized with the clock signal CLK. The second reference pulse signal P is generated by inverting the first reference pulse signal PB. The conditional logic circuit 700 generates the first pulse signal PN and the second pulse signal PPB based upon the test enable signal TE, the test input signal TI, the first reference pulse signal PB and the second reference pulse signal P. As mentioned above, operation modes of the pulse generation circuit 500 may be controlled by the value of test enable signal TE. For example, the test enable signal TE may indicate the test mode when it is activated in logic High level and indicate the normal mode when it is deactivated in logic Low level. The test mode may be a scan test mode for testing an integrated circuit including the flip-flop circuit 200 of FIG. 2.

The conditional logic circuit 700 may invert the first and second reference pulse signals PB and P in the normal mode to generate complementary first and second pulse signals PN and PPB that are simultaneously activated. The conditional logic circuit 700 may deactivate one of the first and second reference pulse signals PB and P in response to the test input signal TI in the test mode to generate the first and second pulse signals PN and PPB that are selectively activated.

Figure 10:
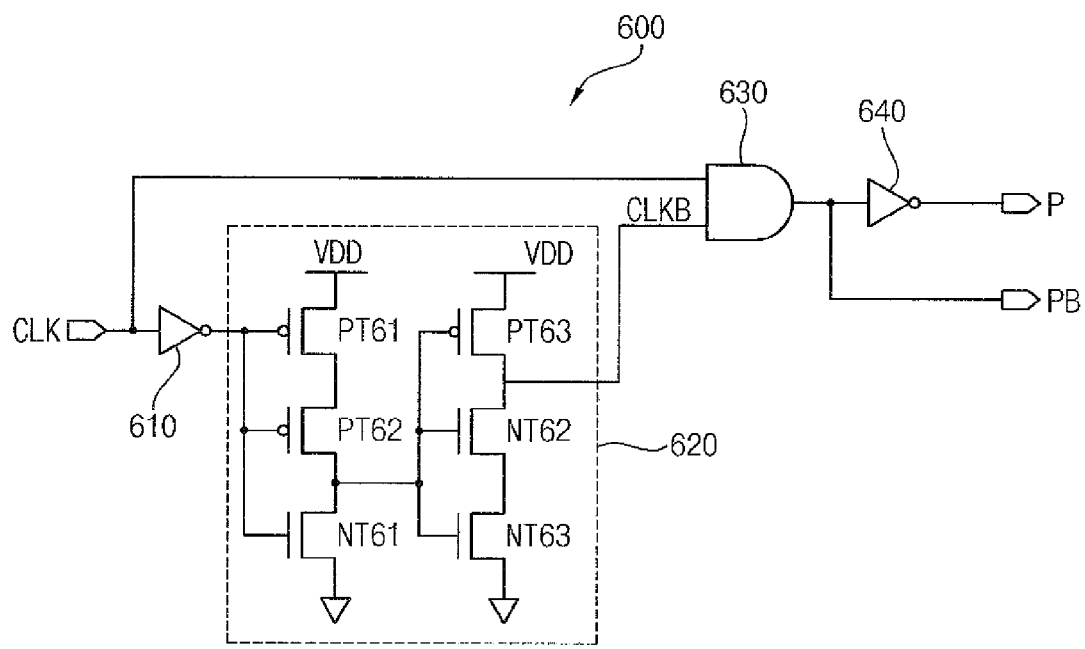
FIG. 10 is a circuit diagram of a pulse generator 600 in the pulse generation circuit 500 of FIG. 9.

FIG. 10 is a circuit diagram of a pulse generator 600 in the pulse generation circuit 500 of FIG. 9.

Referring to FIG. 10, a pulse generator 600 includes a first (input) inverter 610, a delay circuit 620, an AND-gate 630 and a second (output) inverter 640.

The first (input) inverter 610 inverts the received clock signal CLK, and the delay circuit 620 delays the output of the first invert 610. The delay circuit 620 outputs an inverted clock signal CLKB that is delayed with respect to the received clock signal CLK. The delay circuit 620 may include a cascade of inverters, including an inverter including transistors PT61, PT 62 and NT61, and another inverter including transistors PT63, NT 62 and NT63. The delay circuit 620 may include an even number of inverters and the number of inverters may be varied according to a required delay time. The inverters in the delay circuit 620 and inverter 610 of the pulse generator 600 may be varied in many ways (e.g., channel width, channel width, polarity, etc in order to adjust the delay and thus adjust the pulse width of the first and second reference pulse signals PB and P.

The AND-gate 630 performs an AND operation upon the clock signal CLK and the delayed inverted clock signal CLKB to generate the first reference pulse signal PB. In the pulse generator 600, the first reference pulse signal PB includes positive pulses in synchronization with rising edges of the clock signal CLK. The second inverter 640 inverts the first reference pulse signal PB to generate the second (complementary) reference pulse signal P. As a result, the second reference pulse signal P includes negative pulses that are complementary with the positive pulses in the first reference pulse signal PB.

In alternative embodiments, the first and second reference pulse signals PB and P may be pulses in synchronization with falling edges of the clock signal CLK, or include more pulses in synchronization with both rising and falling edges of the clock signal CLK.

Figure 11:
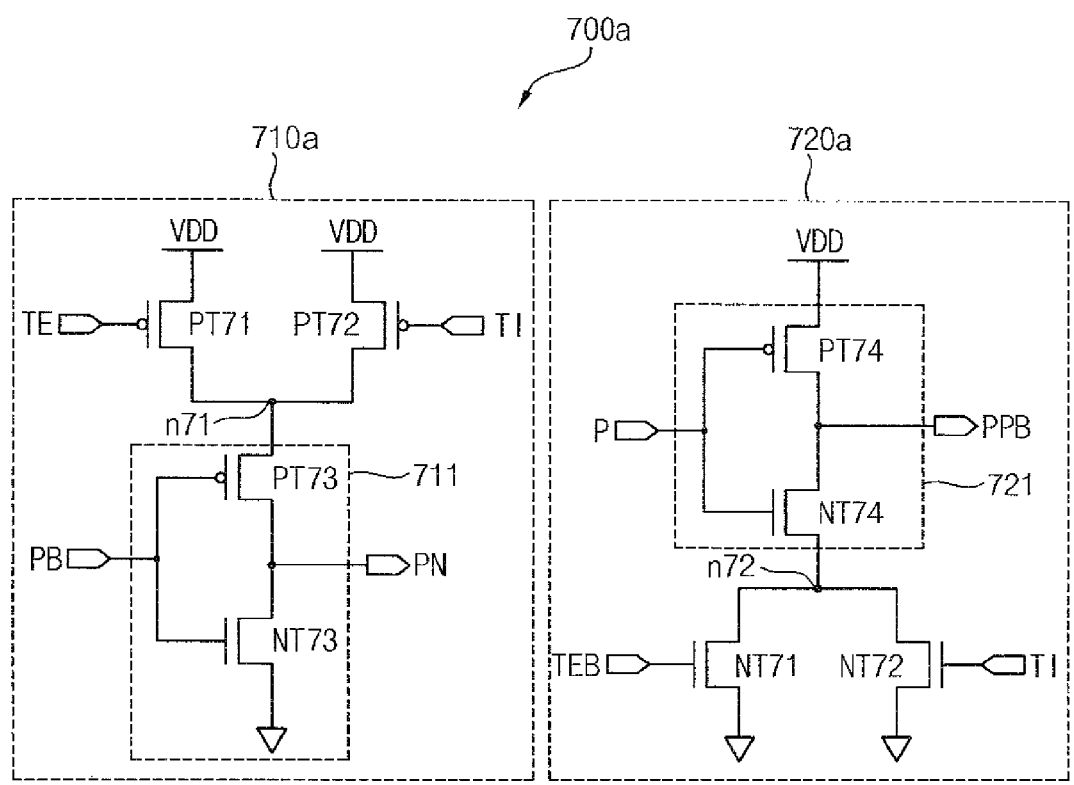
FIG. 11 is a circuit diagram of an example 700a of a conditional logic circuit 700 in the pulse generation circuit 500 of FIG. 9.

FIG. 11 is a circuit diagram of an example 700a of a conditional logic circuit 700 in the pulse generation circuit 500 of FIG. 9.

As illustrated in FIG. 11, a conditional logic circuit 700 (700a) may include a first logic circuit 710a and a second logic circuit 720a. For example, the first logic circuit 710a may generate the first pulse signal PN that is deactivated in logic Low level and activated as positive (logic High) pulses. In a complementary configuration with respect to the first logic circuit 710a, the second logic circuit 720a may generate the second pulse signal PPB that is deactivated in logic High level and activated as negative (logic Low) pulses.

The first logic circuit 710a may include a first PMOS transistor PT71, a second PMOS transistor PT72 and a first inverter 711.

The first PMOS transistor PT71 is connected between a first voltage and a first node n71, and receives the test enable signal TE. The second PMOS transistor PT72 is connected in parallel with first PMOS transistor PT7 between the first voltage and the first node n71, and receives the test input signal TI. The first inverter 711 is connected between the first node n71 and a second voltage, and receives and inverts the first reference pulse signal PB to output the first pulse signal PN. For example, as illustrated in FIG. 11, the first voltage may be the power supply voltage, and the second voltage may be the ground voltage.

The second logic circuit 720a may include a first NMOS transistor NT71, a second NMOS transistor NT72 and a second inverter 721.

The first NMOS transistor NT71 is connected between the second voltage and a second node n72, and receives an inversion signal TEB of the test enable signal TE. The second NMOS transistor NT72 is connected in parallel with the first NMOS transistor N71 between the second voltage and the second node n72, and receives the test input signal TI. The second inverter 721 is connected between the second node n72 and the first voltage, and receives and inverts the second reference pulse signal P to generate the second pulse signal PPB.

In the normal mode, the first PMOS transistor PT71 in the first logic circuit 710a and the first NMOS transistor NT71 in the second logic circuit 720a are turned ON. In this case, the first and second logic circuits 710a and 720a operate as normal inverters irrespective of the test input signal TI.

In the normal mode, the conditional logic circuit 700 (700a) may invert the first and second reference pulse signals PB and P to generate the first and second pulse signal PN and PPB that are simultaneously activated.

In the test mode, the first PMOS transistor PT71 is turned OFF and the second PMOS transistor PT72 is turned ON selectively in response to the test input signal TI. In this case, the first pulse signal PN is activated as positive (logic High) pulses only when the test input signal TI is in logic Low level. In the test mode, the first node n71 is disconnected from the first voltage VDD when the test input signal TI is in logic High level, and thus the first pulse signal PN maintains the deactivated state in logic Low level.

In the test mode, the first NMOS transistor NT71 is turned OFF and the second NMOS transistor NT72 is turned ON selectively in response to the test input signal TI. In the test mode, the second pulse signal PPB may be activated as negative pulses only when the test input signal TI is in logic High level. In the test mode, the second node n72 is disconnected from the second voltage (i.e., the ground voltage) when the test input signal TI is in logic Low level, and thus the second pulse signal PPB maintains the deactivated state in logic High level.

As a result, the conditional logic circuit 700 (700a) may deactivate one of the first and second reference pulse signals PB and P to generate the first and second pulse signal PN and PPB that are selectively activated in the test mode.

Hereinafter, operation of the flip-flop circuit 200 of FIG. 2 and related methods according to exemplary embodiments of the invention are described with reference to FIGS. 12, 13 and 14.

Figure 12:
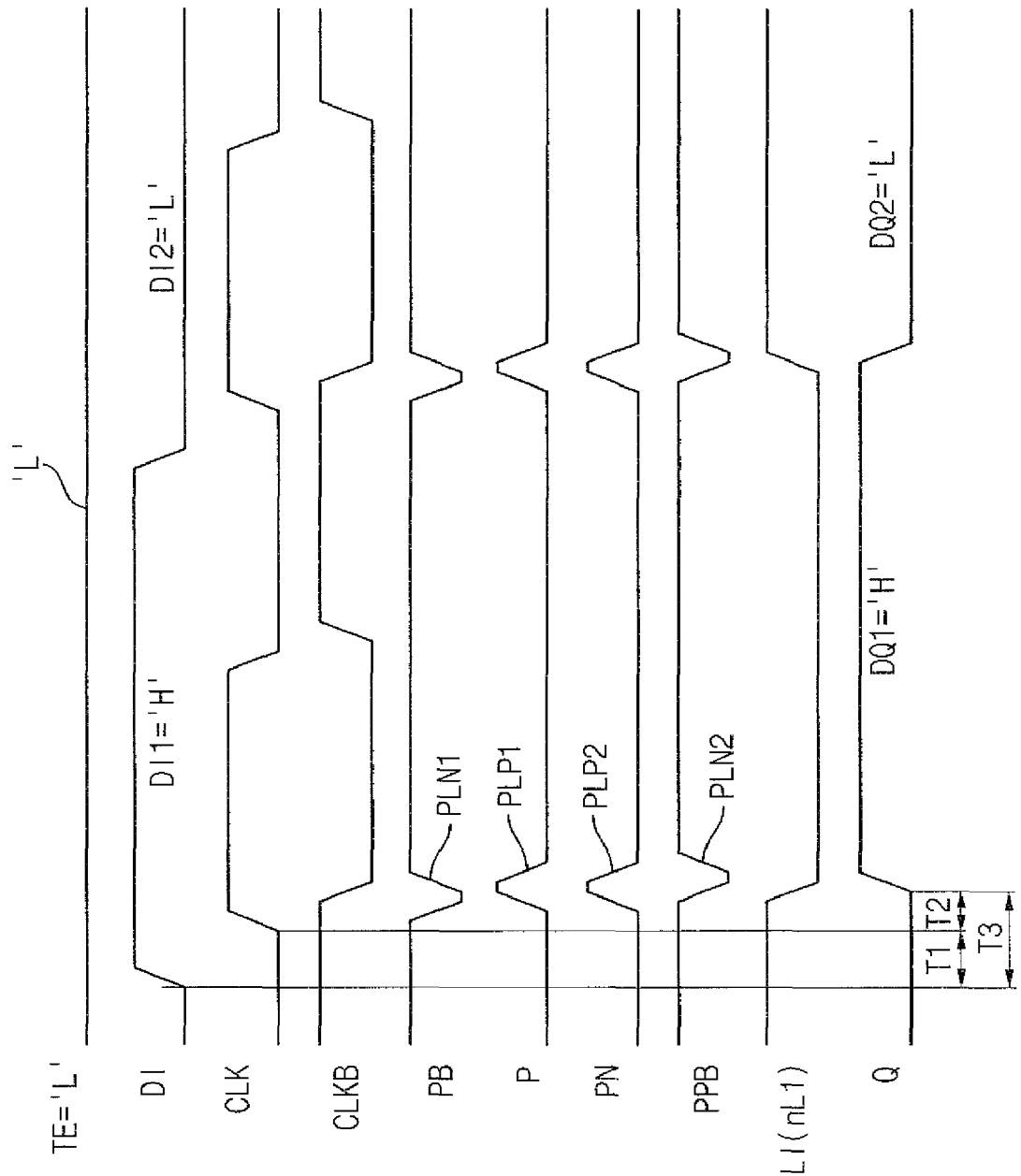
FIG. 12 is a timing diagram of operations in a normal mode of the flip-flop circuit 200 of FIG. 2.

FIG. 12 is a timing diagram illustrating operations in a normal mode of the flip-flop circuit 200 of FIG. 2.

For example, the test enable signal TE may indicate the normal mode when it is deactivated in logic Low level 'L'. By performing a logic operation upon the clock signal CLK and upon the delayed inverted clock signal CLKB, the first reference pulse signal PB and the second reference pulse signal P may be generated. The inverted clock signal CLKB is a signal that is inverted and delayed with respect to the clock signal CLK.

In the normal mode, the complementary first and second reference pulse signals PB and P are both activated. For example, the first reference pulse signal PB may be deactivated in logic High level 'H', and activated as negative pluses PLN1. In this case, the second reference pulse signals P may be deactivated in logic Low level 'L', and activated as positive (logic High) pulses PLP1. The timing points of the negative pulse PLN1 and the positive pulse PLP1 are substantially simultaneous, and need not be exactly simultaneous and symmetrical.

In the normal mode, the first pulse signal PN is generated by inverting the first reference pulse signal PB and the second pulse signal PPB is generated by inverting the second reference pulse signal P. Thus the first pulse signal PN may be activated as positive pulses PLP2 and the second pulse signal PPB may be activated as negative pulses PLN2. As mentioned above, the timing points of the positive pulse PLP2 in the first pulse signal PN and the negative pulse PLN2 in the second pulse signal PPB are substantially simultaneous.

As such, the latch input signal LI corresponding to the data input signal DI in the normal mode may be generated using the first and second pulse signals PN and PPB that are simultaneously activated. The logic level of the latch node nL1 is determined by the latch input signal LI. As illustrated in FIG. 12, the logic level of the latch node nL1 may be opposite to the logic level of the data input signal DI. In this case, the data output signal Q may be generated by inverting the logic level of the latch node nL1.

Figure 1:
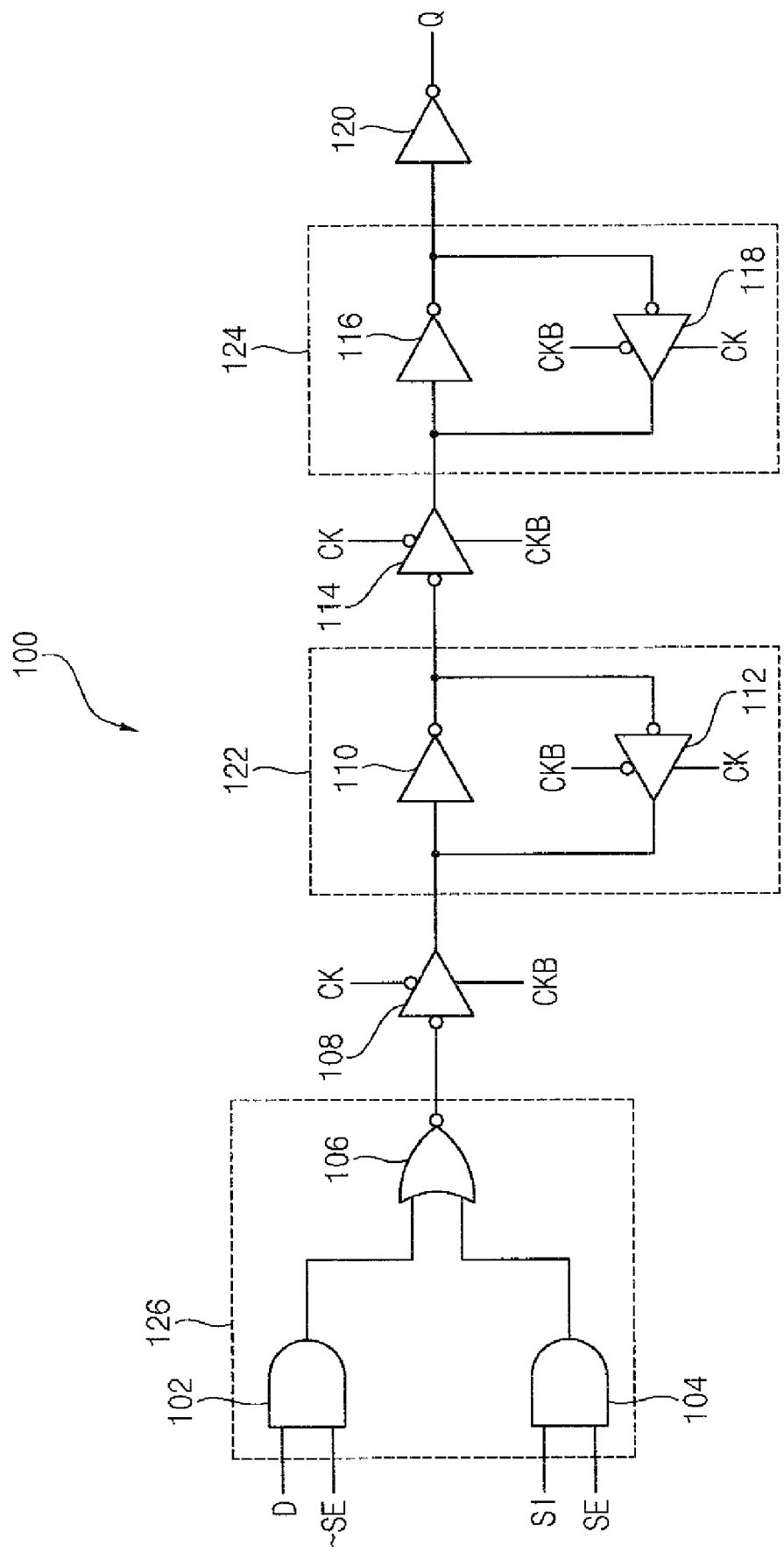
FIG. 1 is a circuit diagram of a conventional master-slave flip-flop circuit.

The DtoQ delay time T3 between input and output of data may be the sum of a setup time T1 from transition of the data input signal DI to transition of the clock signal CLK and a CtoQ delay time from transition of the clock signal CLK to transition of the data output signal Q. As described above, the length of data transfer path may be reduced using pulse-based scheme, and thus the DtoQ delay time may be significantly decreased as compared to the DtoQ delay time of the conventional master-slave flip-flop of FIG. 1.

Figure 13:
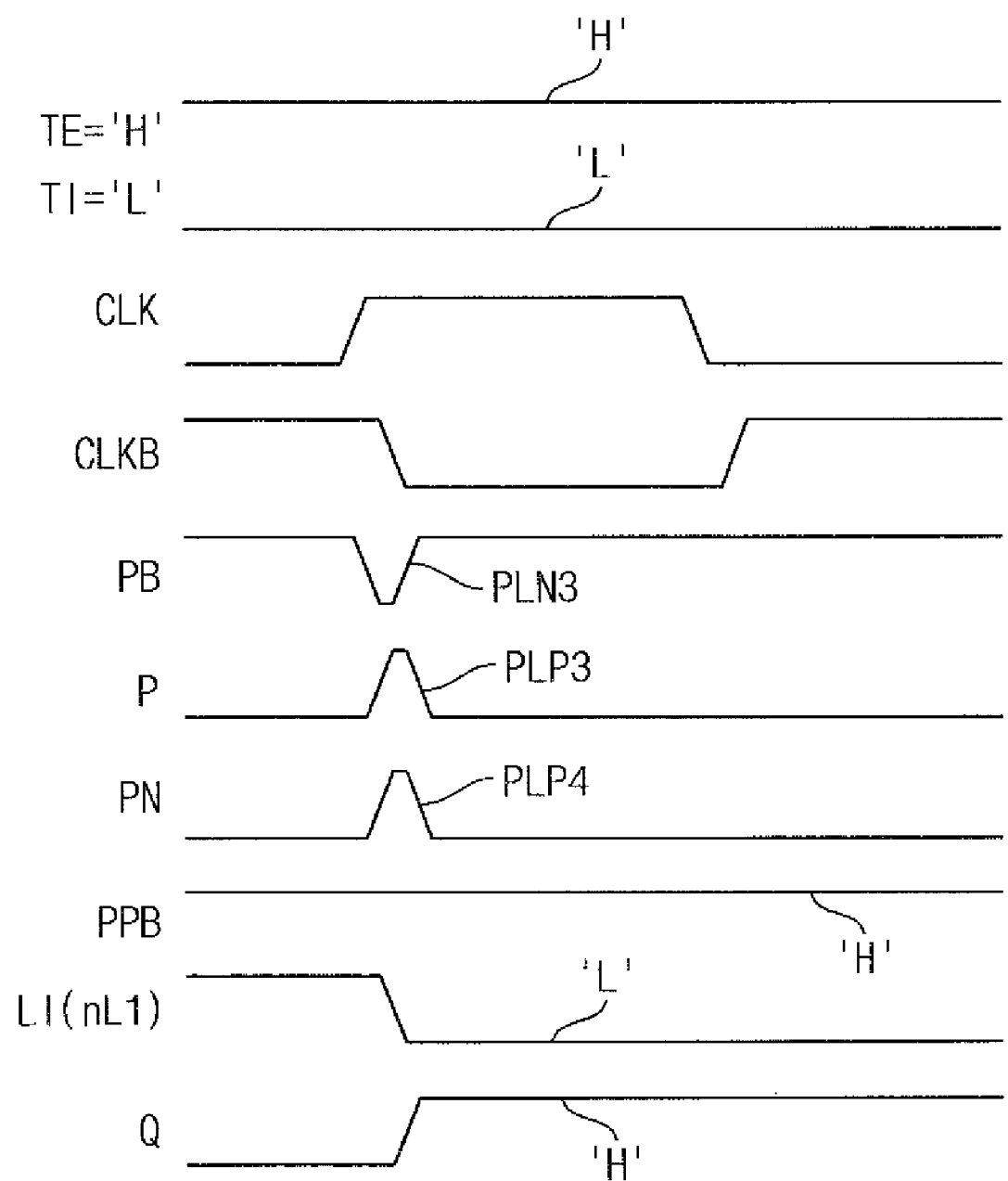
FIGS. 13 and 14 are timing diagrams illustrating operations in a test mode of the flip-flop circuit 200 of FIG. 2.
Figure 14:
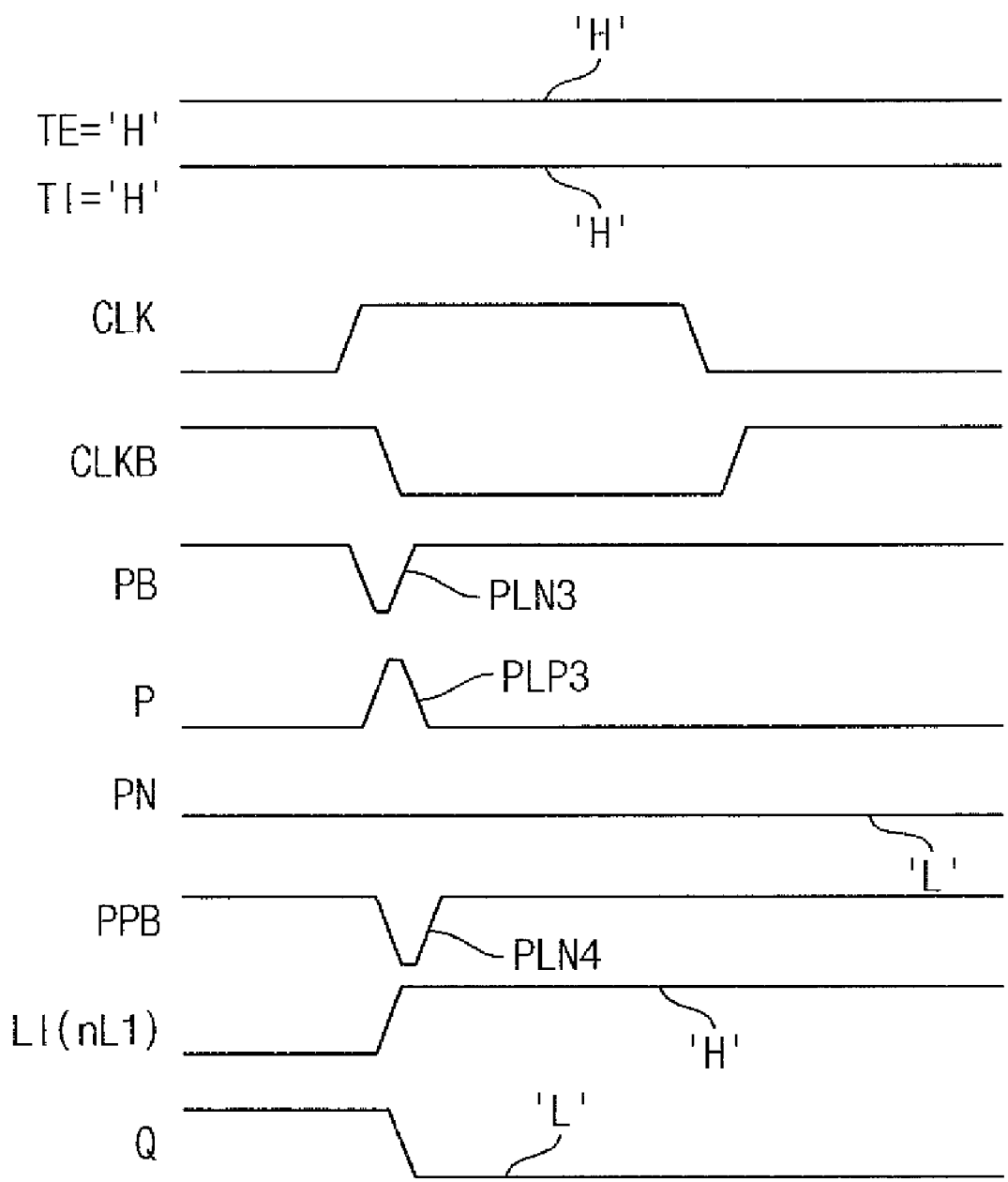

FIGS. 13 and 14 are timing diagrams illustrating operations in a test mode of the flip-flop circuit 200 of FIG. 2.

The test enable signal TE may indicate the test mode when it is activated in logic High level 'H'. As in the normal mode, the first reference pulse signal PB and the second reference pulse signal P are be generated, by performing a logic operation upon the clock signal CLK and the delayed inverted clock signal CLKB. The delayed inverted clock signal CLKB is a signal that is inverted and delayed with respect to the clock signal CLK.

In the test mode as well as in the normal mode, the complementary first and second reference pulse signals PB and P are both activated. For example, the first reference pulse signal PB may be deactivated in logic High level 'H', and activated as negative pluses PLN3. In this case, the second reference pulse signals P may be deactivated in logic Low level 'L', and activated as positive pulses PLP3. The timing of the negative pulse PLN3 and the positive pulse PLP3 are substantially simultaneous.

In the test mode, a selected one of the first and second pulse signals PN and PPB is selected in response to the test input signal TI, irrespective of the data input signal DI.

In case that the test input signal TI is in logic Low level 'L' as illustrated in FIG. 13, the first pulse signal PN is generated by inverting the first reference pulse signal PB, and the second pulse signal PPB is deactivated. For example, the first pulse signal PN is activated as positive pulses PLP4 that are in synchronization with the clock signal CLK while the second pulse signal PPB remains deactivated in logic High level 'H'. As such, the latch input signal LI corresponding to the test input signal TI in logic Low level 'L' is generated in response to the selected one of the first and second pulse signals PN and PPB that is selectively activated. The logic level of the latch node nL1 is determined according the latch input signal LI. In the case that the test input signal TI is in logic Low level 'L' as illustrated in FIG. 13, the latch node nL1 is reset to a logic Low level 'L' in response to the positive pulse PLP4 in the first pulse signal PN and thus the data output signal Q is set in logic High level 'H'.

In case that the test input signal TI is in logic High level 'H' as illustrated in FIG. 14, the second pulse signal PPB is generated by inverting the second reference pulse signal P, and the first pulse signal PN is deactivated. For example, the second pulse signal PPB is activated as negative pulses PLN4 that are in synchronization with the clock signal CLK while the first pulse signal PN remains deactivated in logic Low level 'L'. As such, the latch input signal LI corresponding to the test input signal TI in the logic High level 'H' may be generated in response to the selected one of the first and second pulse signals PN and PPB that are selectively activated. The logic level of the latch node nL1 is determined according the latch input signal LI. In case that the test input signal TI is in logic High level 'H' as illustrated in FIG. 13, the latch node nL1 is set logic High level 'H' in response to the negative pulse PLN4 in the second pulse signal PPB and thus the data output signal Q is reset to a logic Low level 'L'.

As described with reference to FIGS. 12, 13, and 14, in methods of latching data according to exemplary embodiments of the invention, the test-input function may be embodied by controlling a pair of pulse signals. In comparison with the conventional methods such that one of data input or test input is directly selected according to operation modes, data may be latched through shortened data transfer path and thus DtoQ delay time T3 may be reduced in accordance with the described embodiments of the invention.

Referring again to FIG. 11, the first logic circuit 710a generates the first pulse signal PN that is deactivated in logic Low level when the test enable signal TE is activated in logic High level and the test input signal TI is in logic High level. In this case, the PMOS transistor PT71 in the inverter 711 is turned ON at the moment when the first reference pulse signal PB becomes activated as a negative pulse. At that moment, noises such as glitches may be caused in the first pulse signal PN since electric charges may be transferred from the first node n71 to the output node of the inverter 711. Similarly noises may be caused in the second logic circuit 720a due to such charge coupling between the second node n72 and the output node of the inverter 721. The noises may not be critical in some devices depending on operating conditions. Circuits in FIGS. 15 and 16 are provided for reducing such noise due to above-mentioned charge coupling.

Figure 15:
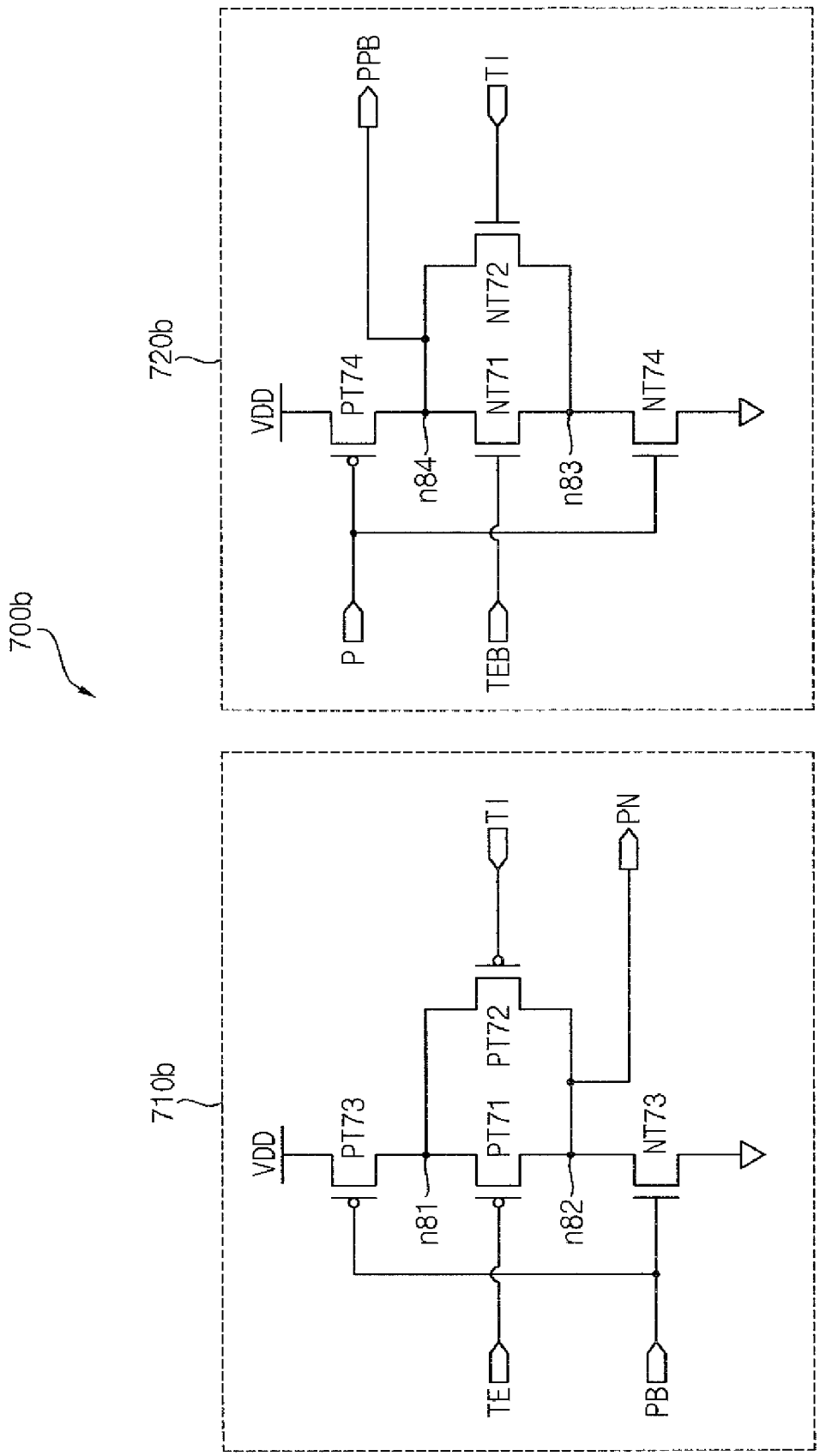
FIGS. 15 and 16 are circuit diagrams illustrating other examples 700b, 700c of a conditional logic circuit 700 in the pulse generation circuit 500 of FIG. 9.
Figure 16:
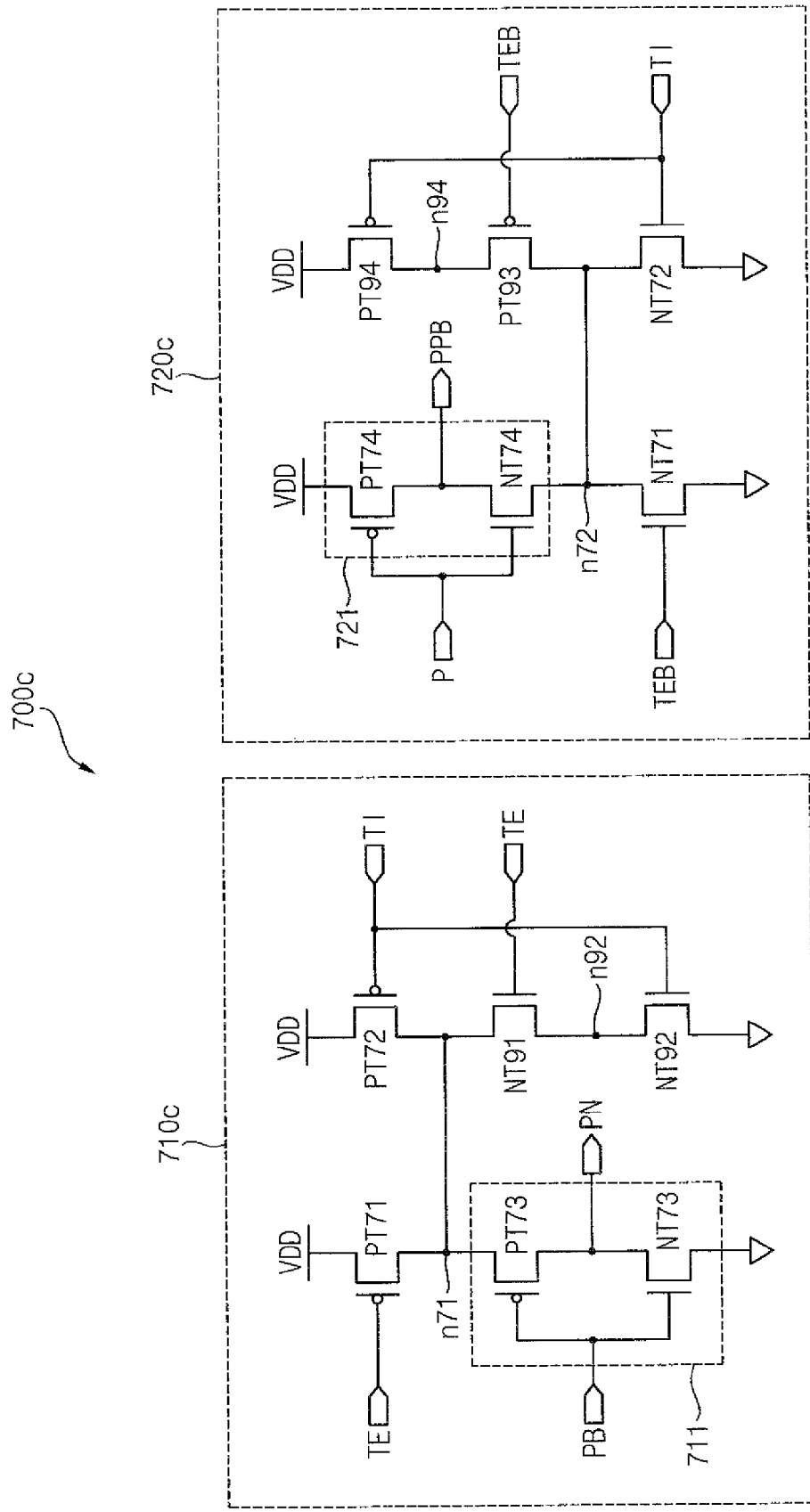

FIGS. 15 and 16 are circuit diagrams of other examples 700b, 700c of a conditional logic circuit 700 in the pulse generation circuit 500 of FIG. 9.

Referring to FIG. 15, a first logic circuit 710b may include a first PMOS transistor PT73, a second PMOS transistor PT71, a third PMOS transistor PT72 and a first NMOS transistor NT73. As in the conditional logic circuit 700a of FIG. 11, in the first logic circuit of the conditional logic circuit 700b of FIG. 15 the first PMOS transistor PT73, and the first NMOS transistor NT73 constitute an inverter, and the second PMOS transistor PT71 and third PMOS transistor PT72 are connected to each other in parallel. The second PMOS transistor PT71 and third PMOS transistor PT72 are connected in series to the first PMOS transistor PT73 and the first NMOS transistor NT73.

The first PMOS transistor PT73 is connected between the first voltage and a first node n81, and receives the first reference pulse signal PB. The second PMOS transistor PT71 is connected between the first node n81 and a second node n82, and receives the test enable signal TE. The first pulse signal PN is output at the second node n82. The first NMOS transistor NT73 is connected between the second node n82 and the second (ground) voltage, and receives the first reference pulse signal PB. The third PMOS transistor PT72 is connected between the first node n81 and the second node n82 in parallel with the second PMOS transistor PT71, and receives the test input signal TI. The first PMOS transistor PT73 and the first NMOS transistor NT7 comprise an inverter, for inverting the first reference pulse signal PB to output the first pulse signal PN. The second PMOS transistor PT71 and the third PMOS transistor PT72 can interrupt only the positive (logic High) operation of the inverter (PT73 and NT73).

The second logic circuit 720b may include a second NMOS transistor NT74, a third NMOS transistor NT71, a fourth NMOS transistor NT72 and a fourth PMOS transistor PT74.

The second NMOS transistor NT74 is connected between the second voltage and a third node n83, and receives the second reference pulse signal P. The third NMOS transistor NT71 is connected between the third node n83 and a fourth node n84, and receives an inversion signal TEB of the test enable signal TE. The second pulse signal PPB is output at the fourth node n84. The fourth PMOS transistor PT74 is connected between the fourth node n84 and the first voltage, and receives the second reference pulse signal P. The fourth NMOS transistor NT72 is connected between the third node n83 and the fourth node n84 in parallel with the third NMOS transistor NT71, and receives the test input signal TI. The second NMOS transistor NT74 and fourth PMOS transistor PT74 comprise an inverter, for inverting the second reference pulse signal P to output the second pulse signal PPB. The fourth NMOS transistor NT72 and the third NMOS transistor NT71 can interrupt only the negative (logic Low) operation of the inverter (PT74 and NT74).

As in the conditional logic circuit 700a of FIG. 11, the conditional logic circuit 700b of FIG. 15 activates simultaneously the first and second pulse signals PN and PPB in the normal mode, and activates selectively the first pulse signal PN or the second pulse signal PPB in the test mode.

The first logic circuit 710b disconnects the first voltage (VDD) and the first node n81 from the second (PN output) node n82, irrespective of the first reference pulse signal PB, when the test input signal TI is in logic High level. In the same way, the second logic circuit 720b disconnects the second (ground) voltage and the third node n83 from the fourth (PPD output) node n84, irrespective of the second reference pulse signal P, when the test input signal TI is in logic Low level. Accordingly the conditional logic circuit 700b of FIG. 15 may reduce the noises due to above described charge coupling.

Referring to FIG. 16, the first logic circuit 710c may include a first PMOS transistor PT71, a first inverter 711, a second PMOS transistor PT72, a third NMOS transistor NT91 and a fourth NMOS transistor NT92. The first logic circuit 710c of the conditional logic circuit 700c of FIG. 16, is the same as the first logic circuit 710a of the conditional logic circuit 700a of FIG. 11, except for the addition of a discharge circuit comprising a third NMOS transistor NT91 and a fourth NMOS transistor NT92 connected in series between the first node n71 and the second (ground) voltage.

The first PMOS transistor PT71 is connected between the first voltage VDD and the first node n71, and receives the test enable signal TE. The first inverter 711 is connected between the first node n71 and the second (ground) voltage, and receives the first reference pulse signal PB to generate the first pulse signal PN. The second PMOS transistor PT72 is connected between the first voltage (VDD) and the first node n71 in parallel with the first PMOS transistor PT71, and receives the test input signal TI. The third NMOS transistor NT91 is connected between the first node n71 and a second node n92, and receives the test enable signal TE. The fourth NMOS transistor NT92 is connected between the second node n92 and the second (ground) voltage, and receives the test input signal TI.

The second logic circuit 720c may include a third NMOS transistor NT71, a second inverter 721, a fourth NMOS transistor NT72, a third PMOS transistor PT93 and a fourth PMOS transistor PT94. The second logic circuit 720c of the conditional logic circuit 700c of FIG. 16, may be the same as the first logic circuit 720a of the conditional logic circuit 700a of FIG. 11, except for the addition of a discharge circuit comprising the third PMOS transistor PT93 and the fourth PMOS transistor PT94 connected in series between the first voltage (VDD) and the node n72.

The third NMOS transistor NT71 is connected between the second voltage and a third node n72, and receives an inversion signal TEB of the test enable signal TE. The second inverter 721 is connected between the third node n72 and the first voltage (VDD), and receives the second reference pulse signal P to generate the second pulse signal PPB. The fourth NMOS transistor NT72 is connected between the second voltage and the third node n72 in parallel with the third NMOS transistor NT71, and receives the test input signal TI. The third PMOS transistor PT93 is connected between the third node n72 and a fourth node n94, and receives the inversion signal TEB of the test enable signal TE. The fourth PMOS transistor PT94 is connected between the fourth node n94 and the first voltage, and receives the test input signal TI.

As in the conditional logic circuit 700a of FIG. 11, the conditional logic circuit 700c of FIG. 16 activates simultaneously the first and second pulse signals PN and PPB in the normal mode, and activates selectively the first pulse signal PN or the second pulse signal PPB in the test mode.

In the first logic circuit 710c, the third NMOS transistor NT91 and the fourth NMOS transistor NT92 are turned ON and a conduction path to ground is formed while the test enable signal TE is activated in logic High level and the test input signal TI is in logic High level. Thus, at the moment when the first reference pulse signal PB becomes activated as a negative pulse, electric charge at the first node n71 may be prevented from inflowing into the output node of the inverter 711.

In the second logic circuit 720c, the third PMOS transistor PT93 and the fourth PMOS transistor PT94 are turned ON and the conduction path to the power supply voltage VDD is formed while the test enable signal TE is activated in logic High level and the test input signal TI is in logic Low level. Thus, at the moment when the second reference pulse signal P becomes activated as a positive pulse, electric charge at the third node n72 may be prevented from inflowing into the output node of the inverter 721. Accordingly the conditional logic circuit 700c of FIG. 16 may reduce the noises due to above described charge coupling by forming the conduction paths.

Figure 17:
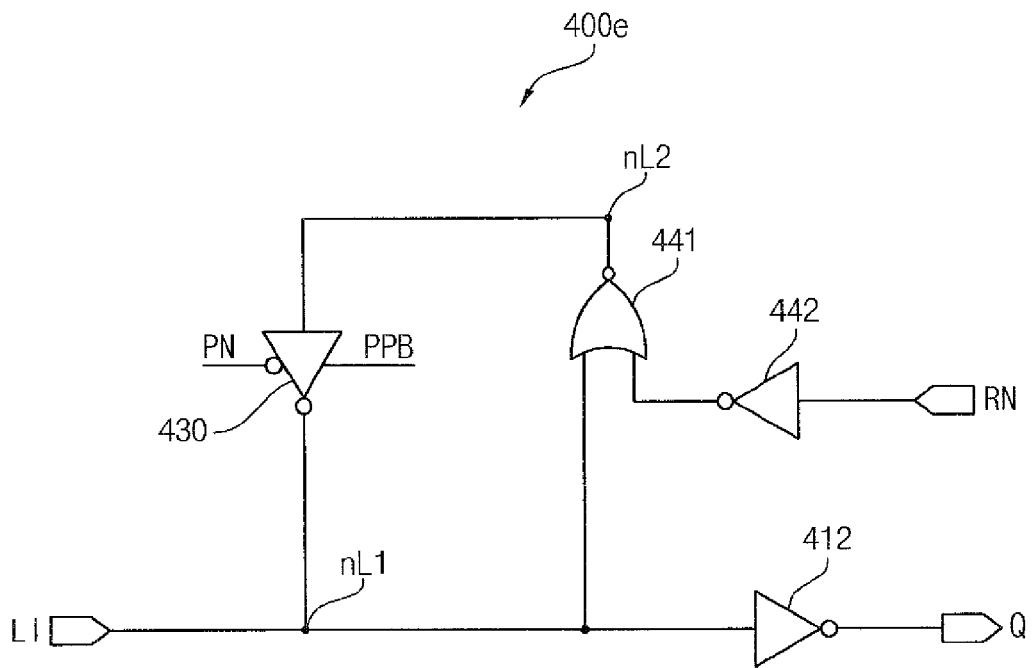
FIG. 17 is a circuit diagram of a latching circuit having a reset function.

FIG. 17 is a circuit diagram of a latching circuit having a reset function.

Referring to FIG. 17, a latching circuit 400e may include a tri-state inverter 430, and a NOR-gate 441.

The NOR-gate 441 performs a NOR operation upon an inversion signal of a reset signal RN and upon a signal (voltage) at a latch node nL1. The inversion signal of a reset signal RN may be output by inverting the reset signal RN using an inverter 442. The tri-state inverter 430 inverts the output voltage of the NOR-gate in response to the first and second pulse signal PN and PPB, and applies the output voltage of the tri-state inverter 430 to the latch node nL1.

For example, when the reset signal RN is activated in logic Low level, the output of the inverter 442 is in logic High level and thus the output of the NOR-gate 441 is in logic Low level irrespective of the logic level at the latch node nL1. The tri-state inverter 430 inverts the output of the NOR-gate 441. As a result, while the reset signal RN is activated in logic Low level, the latch node nL1 is reset to logic High level and the data output signal Q is in logic Low level.

The latching circuit 400e may further include an inverter 412 connected to the latch node nL1. The inverter 412 may function as a buffer or an output driver for inverting and amplifying the signal at the latch node nL1.

Figure 18:
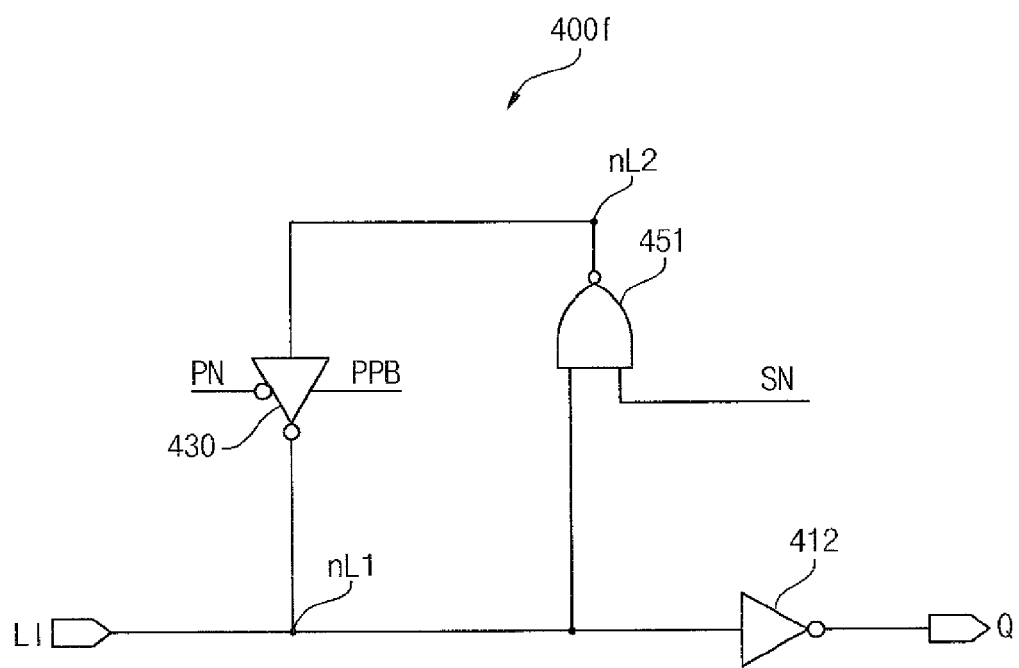
FIG. 18 is a circuit diagram of a latching circuit having a set function.

FIG. 18 is a circuit diagram of a latching circuit having a set function.

Referring to FIG. 18, a latching circuit 400f may include a tri-state inverter 430, and a NAND-gate 451.

The NAND-gate 451 performs a NAND operation upon a set signal SN and upon the signal (voltage) at the latch node nL1. The tri-state inverter 430 inverts an output voltage of the NAND-gate 451 in response to the first and second pulse signal PN and PPB, and applies an output voltage of the tri-state inverter 430 to the latch node nL1.

For example, when the set signal SN is activated in the logic Low level, the output voltage of the NAND-gate 451 is in logic Low level irrespective of the logic level (voltage) at the latch node nL1. The tri-state inverter 430 inverts the output of the NAND-gate 451. As a result, while the set signal SN is activated in the logic Low level, the latch node nL1 is set to logic Low level and the data output signal Q is in logic High level.

The latching circuit 400f of FIG. 18 may further include an inverter 412 connected to the latch node nL1. The inverter 412 may function as a buffer or an output driver for inverting and amplifying the signal at the latch node nL1.

Figure 19:
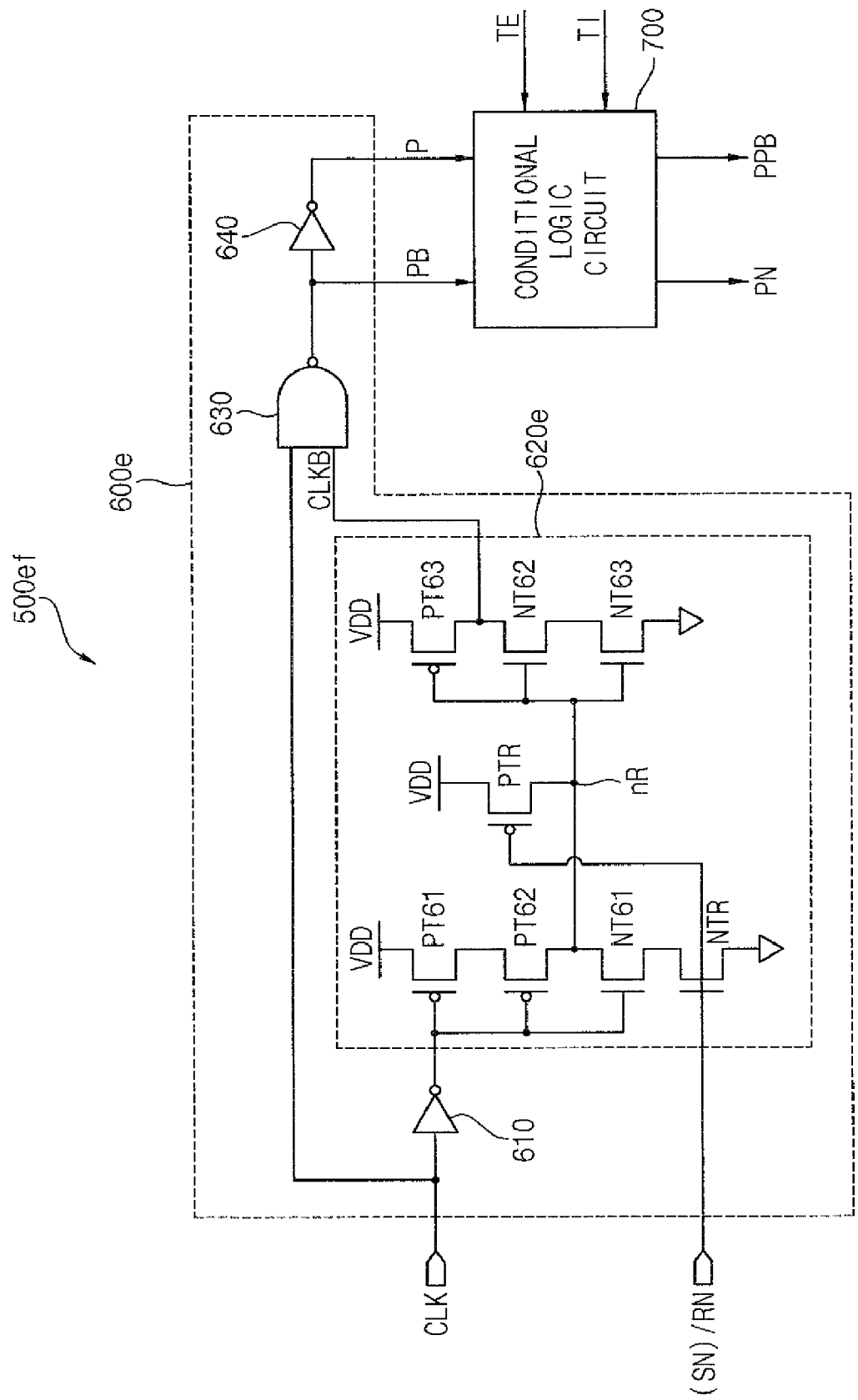
FIG. 19 is a circuit diagram of a pulse generation circuit 500ef providing pulse signals for embodiments of the invention including the latching circuit 400e of FIG. 17 and/or including the latching circuit 400e of FIG. 18.

FIG. 19 is a circuit diagram of a pulse generation circuit 500ef providing pulse signals P and PB for use in embodiments of the invention including the latching circuit 400e of FIG. 17 and/or including the latching circuit 400f of FIG. 18.

The pulse generation circuit 500ef of FIG. 19 is configured to deactivate the first and second pulse signals PN and PPB while the reset signal RN is activated. Compared with the pulse generator 600 of FIG. 10, the pulse generator 600e of FIG. 19 further includes two transistors NTR and PTR for deactivating the reference pulse signals PB and P in response to the reset signal RN. The NMOS transistor NTR is connected between the ground voltage and an inverter consisting of transistors PT61, PT62 and NT61 in the delay circuit 620e, and the PMOS transistor PTR is connected between the power supply voltage VDD and a resetable node nR.

For example, when the reset signal RN is activated in logic Low level, the NMOS transistor NTR is turned OFF and disconnects the inverter PT61, PT62 and NT61 from the ground voltage. At the same time, the PMOS transistor PTR is turned ON and pulls up the voltage at the resetable node nR to logic High (reset) level. Thus, while the reset signal RN is activated in logic Low level, the delayed inverted clock signal CLKB outputted by the delay circuit 620e maintains the logic Low level and thus the first reference pulse signal PB outputted from the NAND-gate 630 is in logic High level irrespective of the clock signal CLK. In other words, while the reset signal RN is activated in logic Low level, the first reference pulse signal PB is deactivated to a logic High level and does not include negative pulses. Also the second reference pulse signal P is deactivated to a logic Low level and does not include positive pulses.

As a result, in the conditional logic circuit 700, the first pulse signal PN is deactivated to a logic Low level and the second pulse signal PPB is deactivated to a logic High level while the reset signal RN is activated in the logic Low level. Accordingly the tri-state inverter 430 of the latching circuit 400e of FIG. 17 operates as a normal inverter while the reset signal RN is activated. Furthermore, the transistors TP13 and NT12 comprising an inverter in the input multiplexing circuit 300 of FIG. 3 are turned OFF to float the output node n13 of the input multiplexing circuit 300, and thus the latching circuit 400e of FIG. 17 may be reset irrespective of the value of data input signal DI.

Thus, an asynchronous reset or set functions may be included in exemplary embodiments using the latching circuit 400e of FIG. 17 and the pulse generation circuit 500ef of FIG. 19.

And, an asynchronous set function may be embodied using the latching circuit 400f of FIG. 18 and the pulse generation circuit 500ef of FIG. 19.

The above described exemplary embodiments of the invention may be applied to flip-flop circuits requiring a relatively high operation speed with a test-input function, and thus may be included in arbitrary integrated circuits and devices requiring high integration with respective inputs according to operation modes.

While the exemplary embodiments of the invention have been described in detail, it should be understood that various changes, substitutions and alterations may be made herein without departing from the scope of the invention.

What is claimed is:

1. A flip-flop circuit comprising:
   a pulse generation circuit configured to generate a first pulse signal and a second pulse signal, the first and second pulse signals being activated simultaneously while in a normal mode, and being selectively activated individually based upon a test input signal while in a test mode;
   an input circuit configured to generate a latch input signal based upon a data input signal, the first pulse signal and the second pulse signal, wherein the latch input signal corresponds to the data input signal while in the normal mode and corresponds to the test input signal while in the test mode; and
   a latching circuit configured to latch the latch input signal.

2. The flip-flop circuit of claim 1, wherein while in the test mode the input circuit generates the latch input signal corresponding to the test input signal in response to the first and second pulse signals, irrespective of the data input signal.

3. The flip-flop circuit of claim 1, wherein the input circuit includes:
   a pair of first-type transistors connected in parallel, the transistor gate of each of the first-type transistors receiving one of the data input signal and an inversion signal of a test enable signal;
   a pair of second-type transistors connected in parallel, the transistor gate of each of the second-type transistors receiving one of the data input signal and the test enable signal;
   a first-type pulse-controlled transistor having its transistor gate receiving the first pulse signal; and
   a second-type pulse-controlled transistor having its transistor gate receiving the second pulse signal,
   wherein the pair of first-type transistors, the first-type pulse-controlled transistor, the second-type pulse-controlled transistor, and the pair of second-type transistors are connected in series between a power supply voltage and a ground voltage.

4. The flip-flop circuit of claim 1, wherein the input circuit includes:
   a first p-type metal oxide semiconductor (PMOS) transistor connected between a first voltage and a first node, the transistor gate of the first PMOS transistor receiving the data input signal;
   a second PMOS transistor connected between the first voltage and the first node in parallel with the first PMOS transistor, the transistor gate of the second PMOS transistor receiving an inversion signal of a test enable signal;

a third PMOS transistor connected between the first node and an output node, the transistor gate of the third PMOS transistor receiving the second pulse signal;
a first n-type metal oxide semiconductor (NMOS) transistor connected between a second voltage and a second node, the transistor gate of the first NMOS transistor receiving the data input signal;
a second NMOS transistor connected between the second voltage and the second node in parallel with the first NMOS transistor, the transistor gate of the second NMOS transistor receiving the test enable signal; and
a third NMOS transistor connected between the second node and the output node, the transistor gate of the third NMOS transistor receiving the first pulse signal.

5. The flip-flop circuit of claim 1, wherein the pulse generation circuit includes:
a pulse generator configured to generate a first reference pulse signal and a second reference pulse signal based upon a received clock signal, the second reference pulse signal being an inversion signal of the first reference pulse signal; and
a conditional logic circuit configured to generate the first and second pulse signal based upon the first reference pulse signal and the second reference pulse signal while in the normal mode, and to generate the first and second pulse signal based upon test input signal and the first reference pulse signal and the second reference pulse signal while in the test mode.

6. The flip-flop circuit of claim 5, wherein the conditional logic circuit is configured to:
invert the first and second reference pulse signals in the normal mode to generate simultaneous first and second pulse signals; and
deactivate one of the first and second reference pulse signals in response to the test input signal while in the test mode to select and activate one of the first and second pulse signals.

7. The flip-flop circuit of claim 5, wherein the conditional logic circuit includes:
a first logic circuit configured to generate the first pulse signal that includes positive pulses while activated; and
a second logic circuit configured to generate the second pulse signal that includes negative pulses while activated.

8. The flip-flop circuit of claim 7, wherein the first logic circuit includes:
a first PMOS transistor having its transistor gate receiving a test enable signal;
a second PMOS transistor connected in parallel with the first PMOS transistor, and having its transistor gate receiving the test input signal;
a third PMOS transistor having its transistor gate receiving the first reference pulse signal
a first NMOS transistor having its transistor gate receiving the first reference pulse signal;
wherein the first and third PMOS transistors and the first NMOS transistor are connected in series between a first voltage and a second voltage, wherein the third PMOS transistor and the first NMOS transistor comprise a first inverter configured to invert the first reference pulse signal and to output the first pulse signal.

9. The flip-flop circuit of claim 8, wherein the first logic circuit further includes:
a second NMOS transistor having its transistor gate receiving the test enable signal; and
a third NMOS transistor having its transistor gate receiving the test input signal, wherein the first PMOS and the second PMOS transistor are connected in parallel between a first voltage and a first node,
wherein third PMOS transistor and the first NMOS transistor are connected in series between the first node and the second voltage, and
wherein the second NMOS transistor and the third NMOS transistor are connected in series between the first node and the second voltage.

10. The flip-flop circuit of claim 8, wherein the second logic circuit includes:
a second NMOS transistor connected between the second voltage and a second node, the second NMOS transistor having its transistor gate receiving an inversion signal of the test enable signal;
a third NMOS transistor connected between the second voltage and the second node in parallel with the second NMOS transistor, the third NMOS transistor having its transistor gate receiving the test input signal; and
a second inverter connected between the second node and the second voltage, the second inverter configured to invert the second reference pulse signal and to output the second pulse signal.

11. The flip-flop circuit of claim 7, wherein the first logic circuit includes:
a first PMOS transistor connected between a first voltage and a first node, the first PMOS transistor having its transistor gate receiving the first reference pulse signal;
a second PMOS transistor connected between the first node and a second node, the first pulse signal being output at the second node, the second PMOS transistor having its transistor gate receiving a test enable signal;
a first NMOS transistor connected between the second node and a second voltage, the first NMOS transistor having its transistor gate receiving the first reference pulse signal; and
a third PMOS transistor connected between the first node and the second node in parallel with the second PMOS transistor, the third PMOS transistor having its transistor gate receiving the test input signal.

12. The flip-flop circuit of claim 1, wherein the latching circuit includes:
a tri-state inverter configured to operate in response to the first and second pulse signals.

13. The flip-flop circuit of claim 1, wherein the latching circuit includes:
a latch node configured to receive the latch input signal;
a NOR-gate configured to perform a NOR operation upon an inversion signal of a reset signal and the latch input signal; and
a tri-state inverter controlled by the first and second pulse signal and configured to invert the output of the NOR-gate, and configured to apply the output of the tri-state inverter to the latch node.

14. The flip-flop circuit of claim 13, wherein the first and second pulse signal deactivate the tri-state inverter while the reset signal is activated.

15. The flip-flop circuit of claim 1, wherein the latching circuit includes:
a latch node configured to receive the latch input signal;
a NAND-gate configured to perform a NAND operation upon a set signal and the latch input signal; and
a tri-state inverter controlled by the first and second pulse signal and configured to invert the output of the NAND-gate in response to the first and second pulse signal, and configured to apply the output of the tri-state inverter to the latch node.

16. The flip-flop circuit of claim 15, wherein the first and second pulse signal deactivate the tri-state inverter while the set signal is activated.

17. A method comprising:
- generating a first pulse signal and a second pulse signal, the first and second pulse signals being activated simultaneously while in a normal mode and being selectively activated individually in response to a test input signal while in a test mode;
- generating a latch input signal in response to the first pulse signal and the second pulse signal, wherein the latch input signal corresponds to the data input signal while in the normal mode and corresponds to the test input signal while in the test mode; and
- latching the latch input signal.

18. The method of claim 17, wherein generating the latch input signal includes:
- selecting one of the data input signal and the test input signal based on the first and second pulse signals to generate the latch input signal.

19. The method of claim 17, wherein generating the latch input signal includes:
- selecting one of a power supply voltage and a ground voltage based upon the test input signal, and outputting the selected one of the power supply voltage and the ground voltage irrespective of the data input signal while in the test mode.

20. The method of claim of claim 17, wherein generating the first pulse signal and the second pulse signal includes:
- selecting a first conduction path based upon the data input signal while in the normal mode; and
- selecting a second conduction path based upon to a test enable signal while in the test mode.

* * * * *